(12) United States Patent
Young et al.

(10) Patent No.: US 12,062,834 B2
(45) Date of Patent: *Aug. 13, 2024

(54) RADIO FREQUENCY TUNING USING A MULTICHIP MODULE ELECTRICAL INTERCONNECT STRUCTURE

(71) Applicant: Honeywell Federal Manufacturing & Technologies, LLC, Kansas City, MO (US)

(72) Inventors: Barbara Diane Young, Raymore, MO (US); Steven James Sedlock, Raymore, MO (US); Kevin Christopher Ledden, Raymore, MO (US); Alan Ahlberg Elliot, Lees Summit, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/461,654

(22) Filed: Sep. 6, 2023

(65) Prior Publication Data
US 2023/0411827 A1    Dec. 21, 2023

Related U.S. Application Data

(63) Continuation of application No. 17/511,054, filed on Oct. 26, 2021, now Pat. No. 11,811,132.

(51) Int. Cl.
*H01Q 1/38*  (2006.01)
*H01Q 1/22*  (2006.01)
*H01Q 1/42*  (2006.01)

(52) U.S. Cl.
CPC ............ *H01Q 1/2283* (2013.01); *H01Q 1/38* (2013.01); *H01Q 1/422* (2013.01)

(58) Field of Classification Search
CPC ..................................................... H01Q 1/2283
USPC ........................................................... 343/702
See application file for complete search history.

(56) References Cited

U.S. PATENT DOCUMENTS 11,811,132 B2 *  11/2023  Young ..................... H01L 23/66

* cited by examiner

*Primary Examiner* — Peguy Jean Pierre
(74) *Attorney, Agent, or Firm* — HOVEY WILLIAMS LLP

(57) ABSTRACT

A method for tuning a resonant frequency of wireless communication circuitry on a multichip module including a plurality of chips includes applying an electrical insulator to an upper surface of the multichip module; creating a plurality of openings in the electrical insulator, each opening being positioned at a successive one of the bond pads to be electrically connected to create a plurality of exposed bond pads; applying metal to each exposed bond pad to form a successive one of a plurality of interconnect bases; removing a portion of the layer of photoresist to create a plurality of bridge supports, each bridge support positioned between a successive pair of interconnect bases; applying metal to each bridge support and associated interconnect bases to form a successive one of the interconnect traces; removing the bridge supports; and disconnecting one or more of the interconnect traces as necessary to obtain a target resonant frequency.

11 Claims, 35 Drawing Sheets

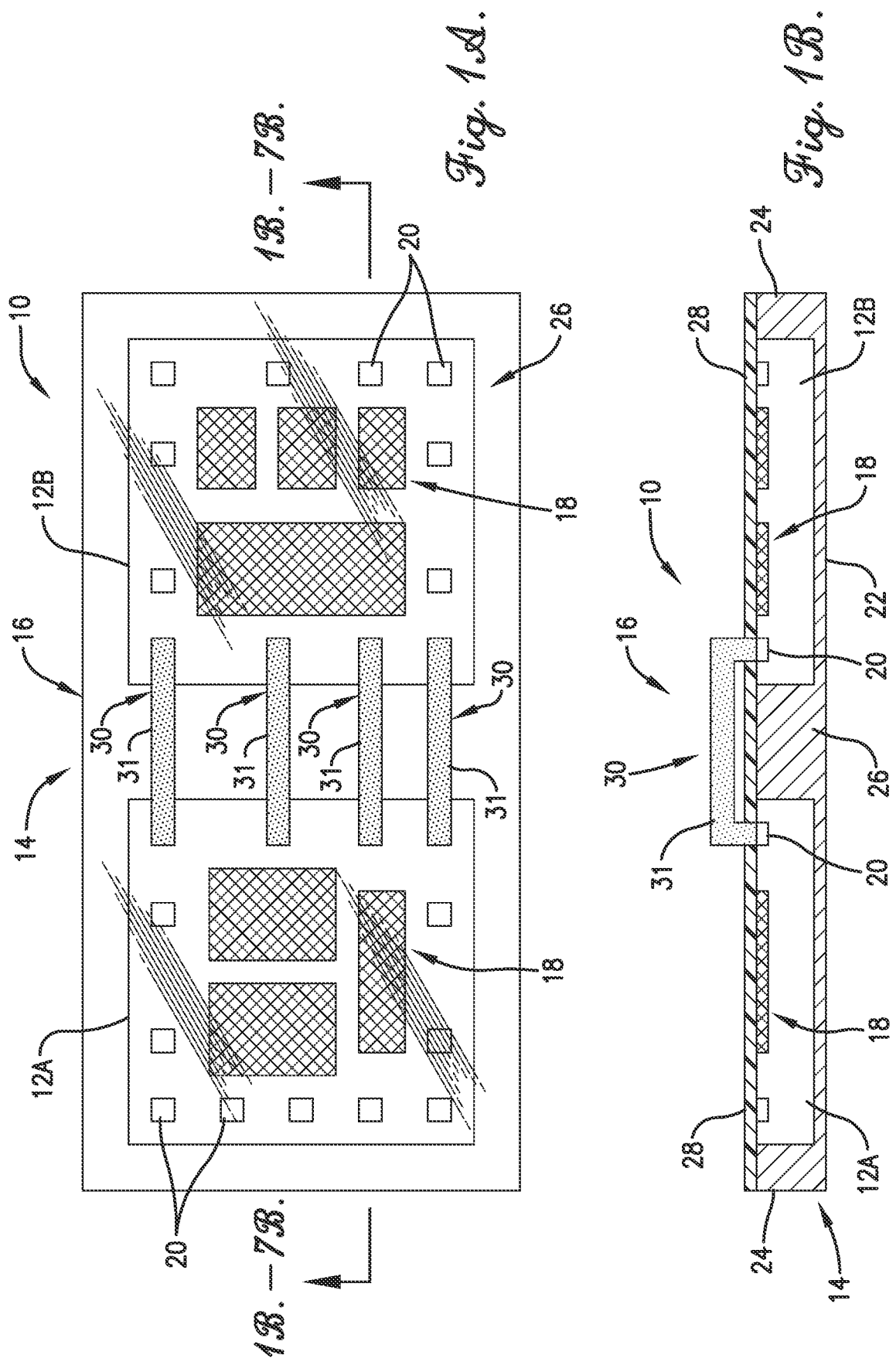

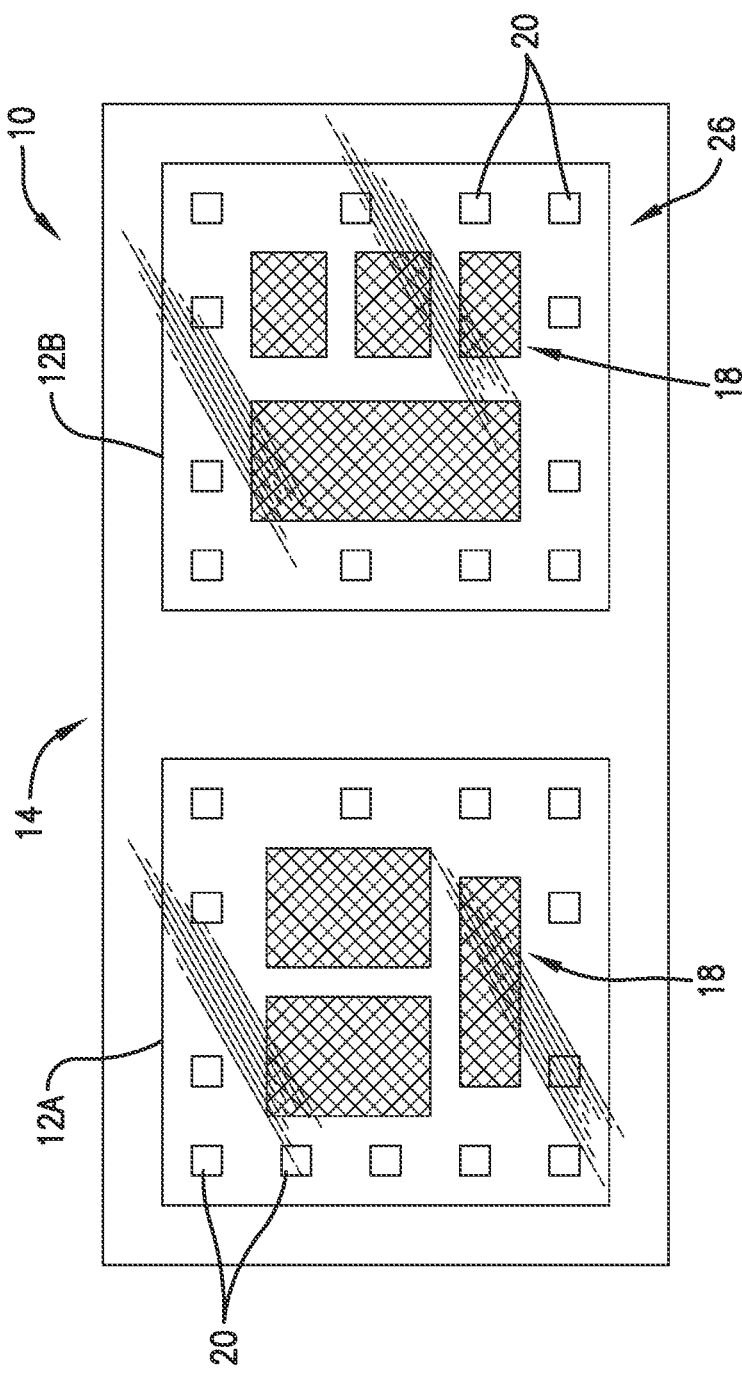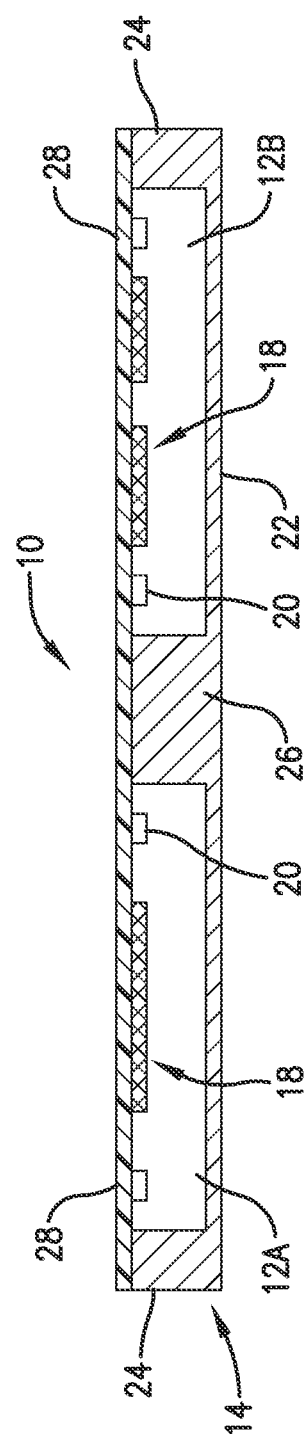

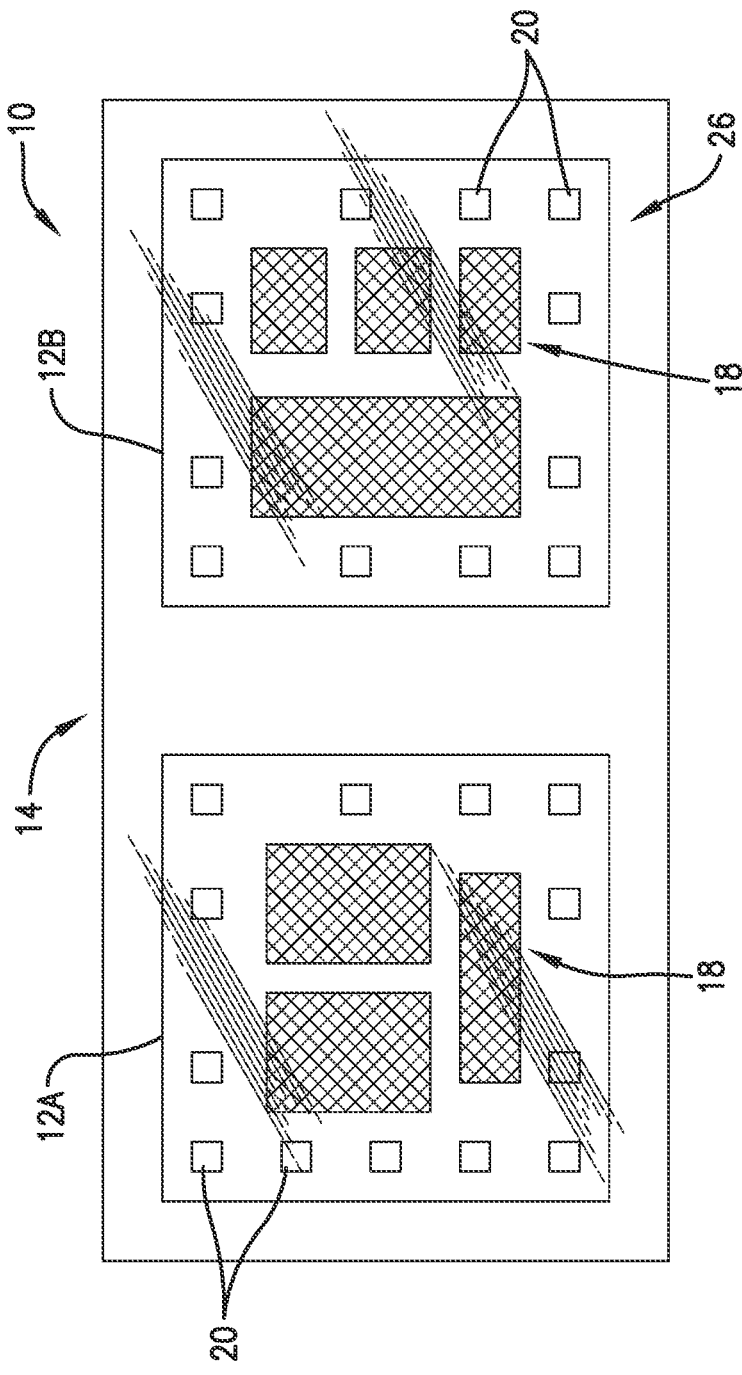
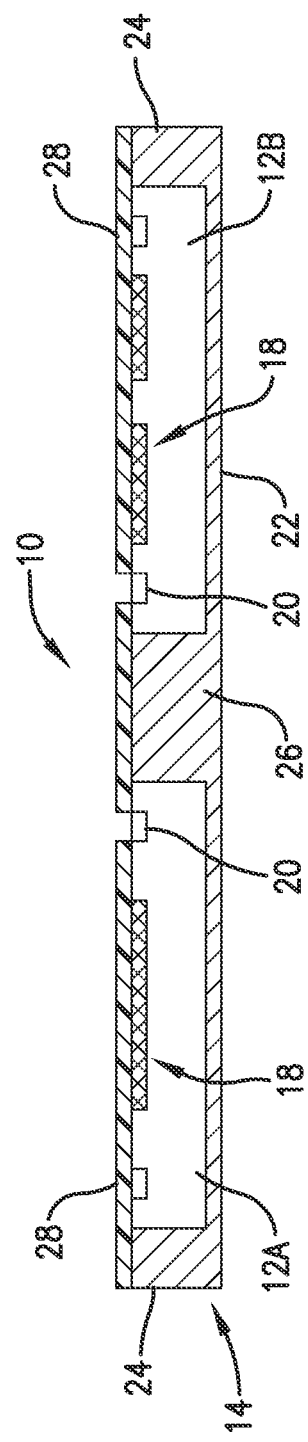

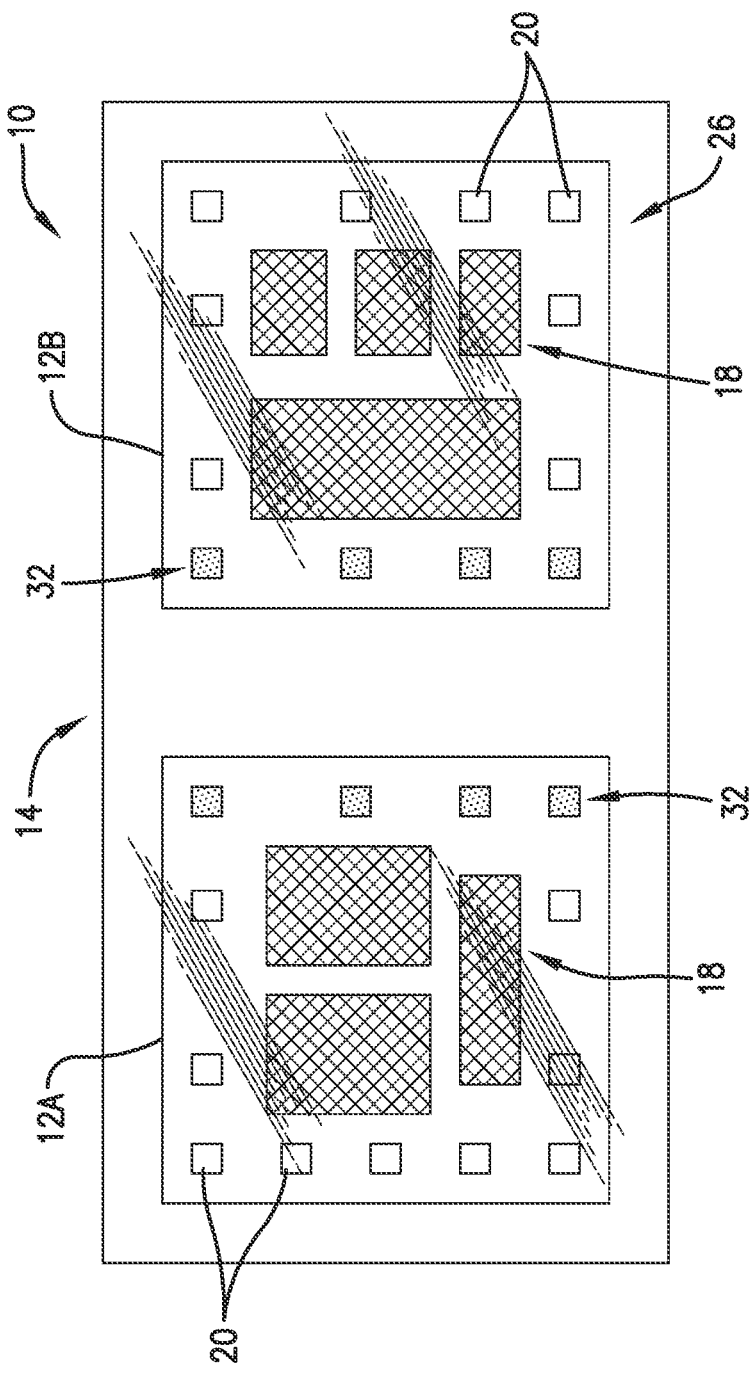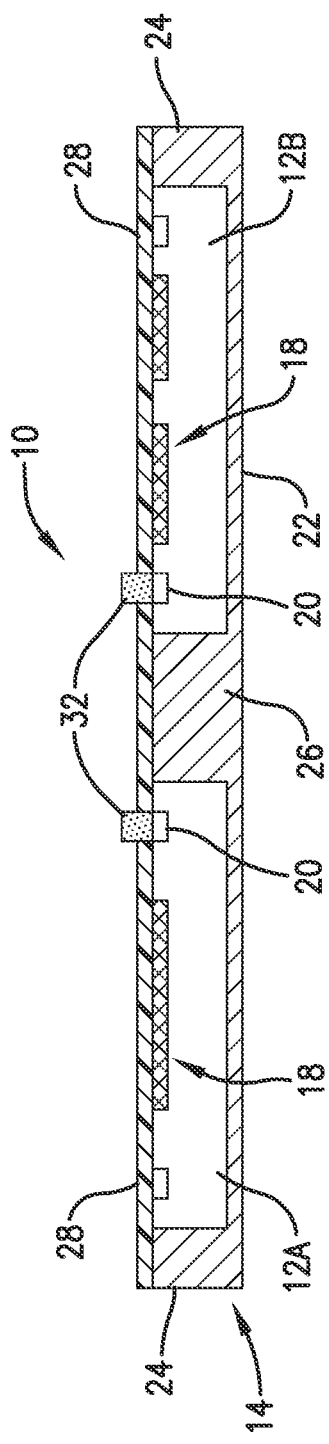

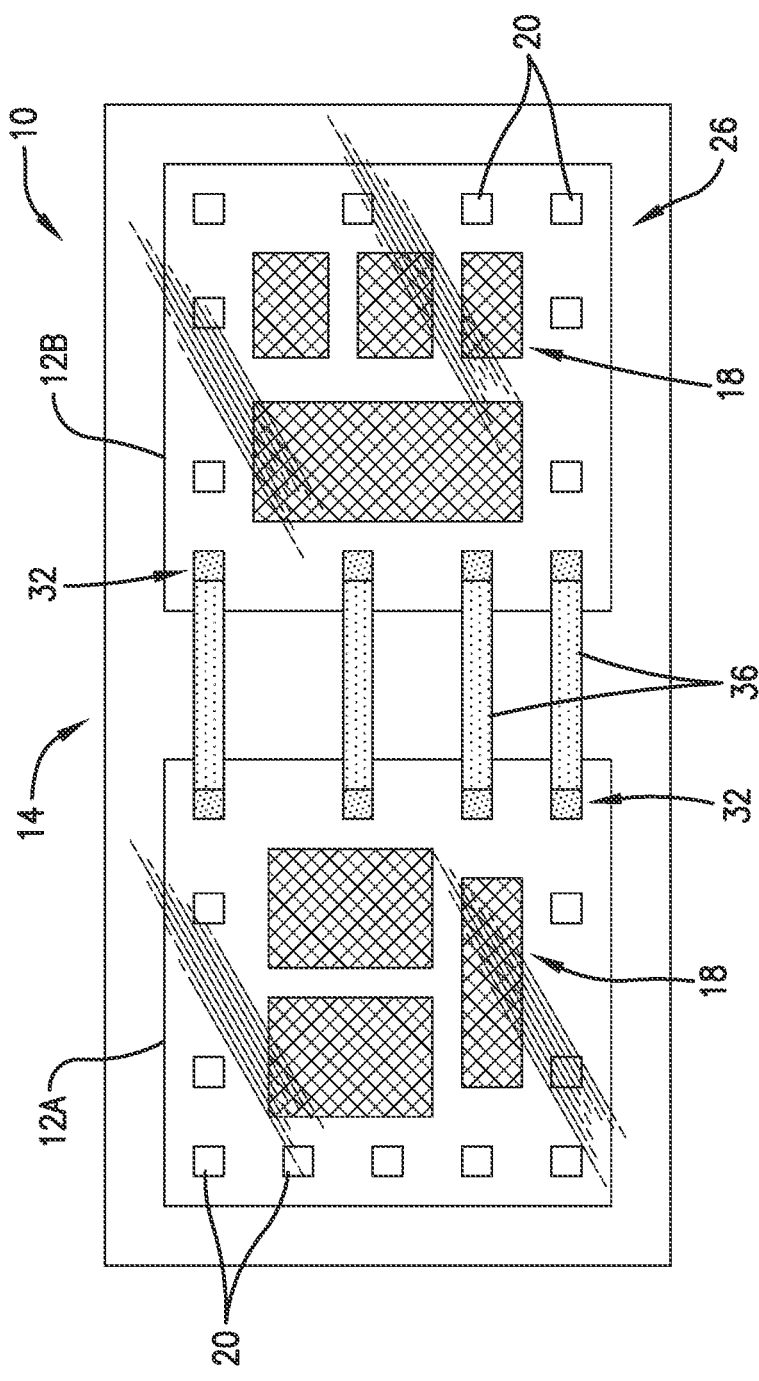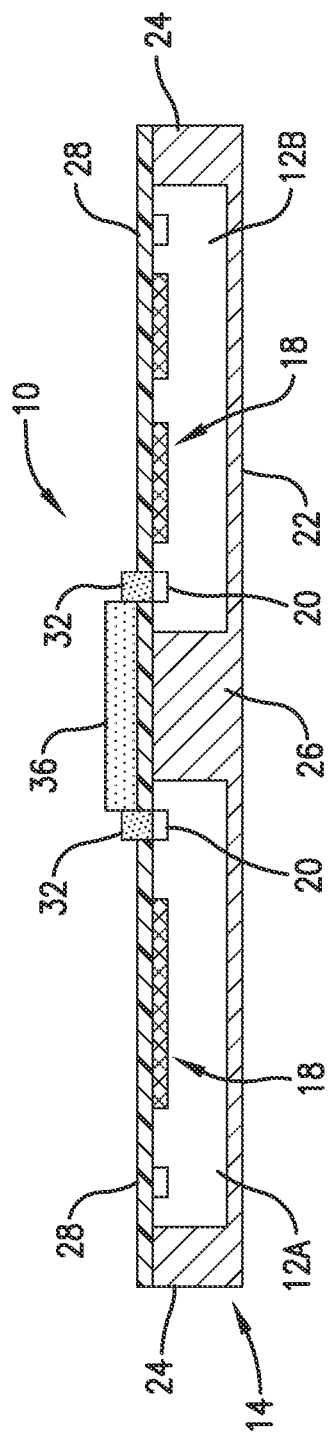

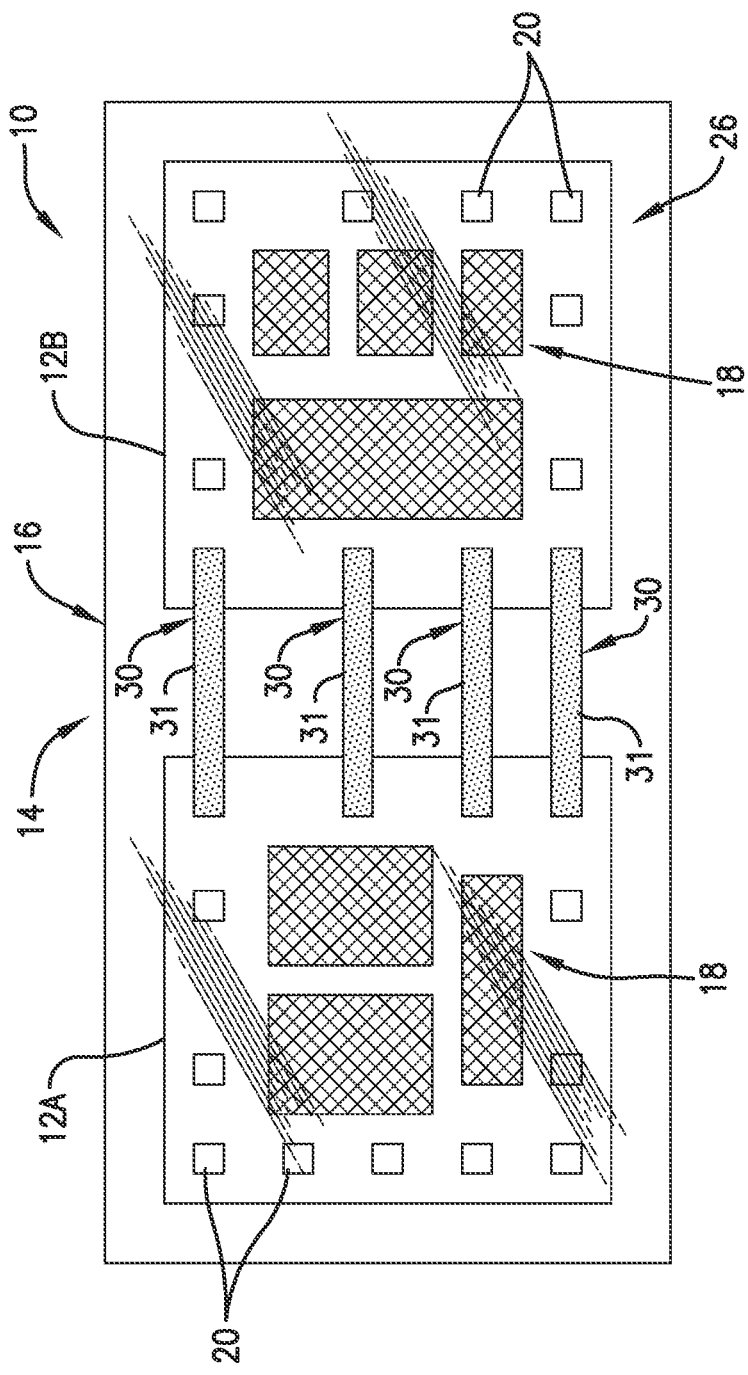
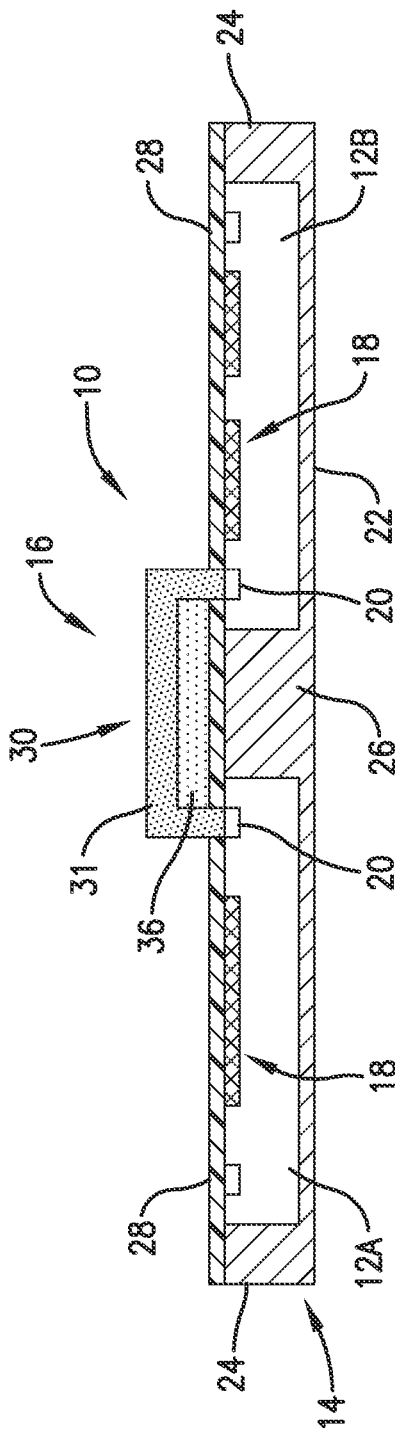

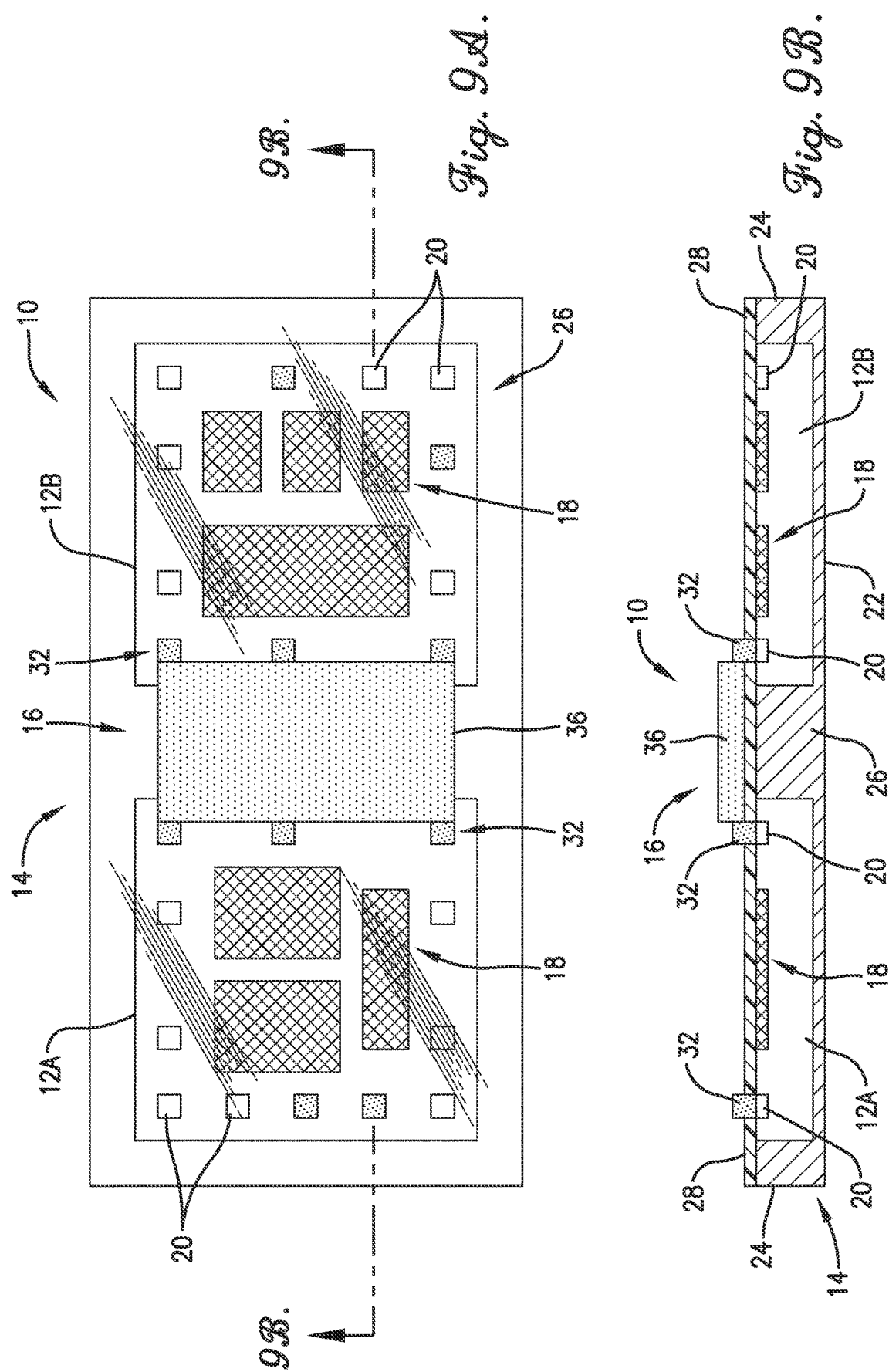

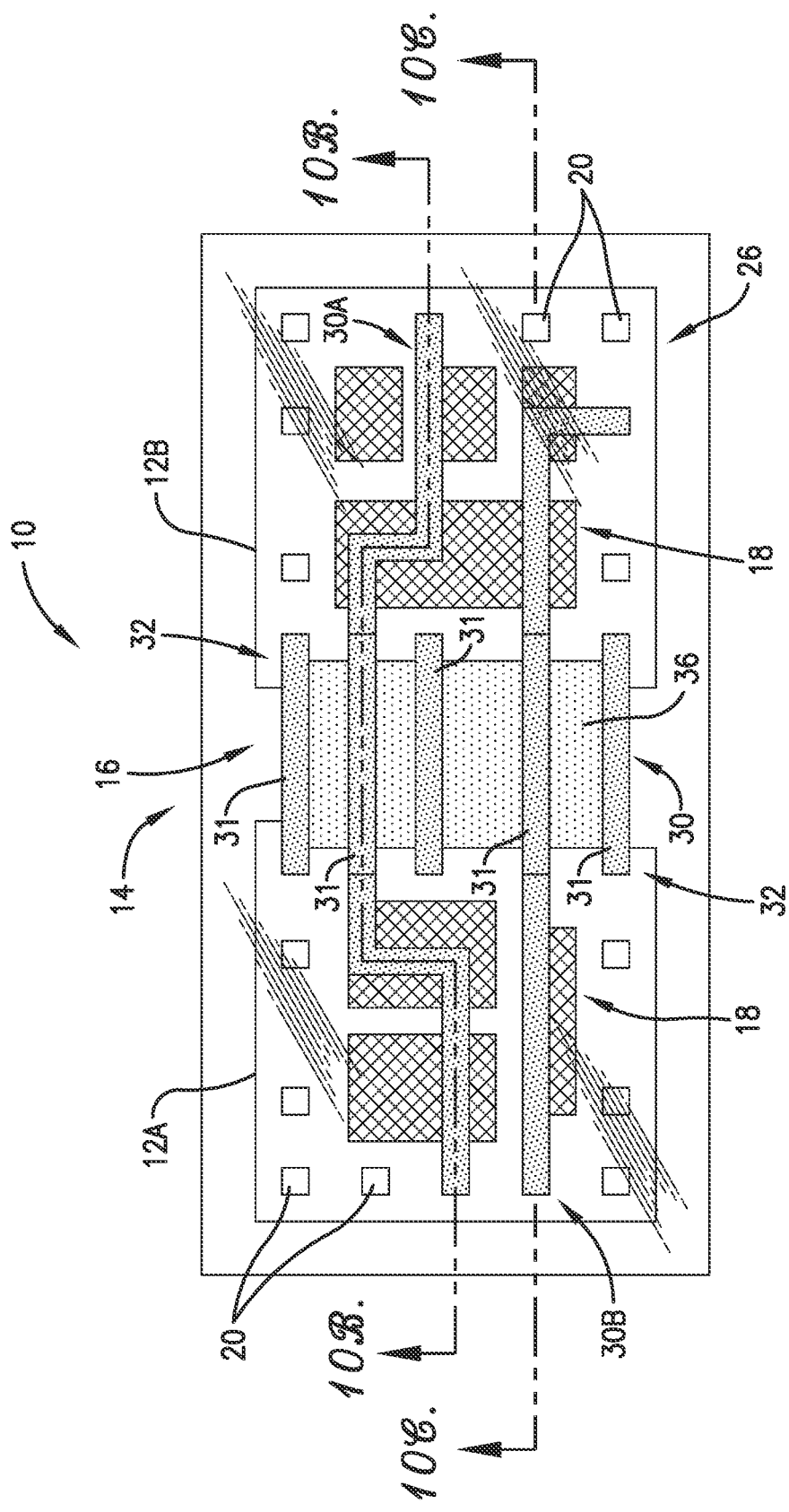

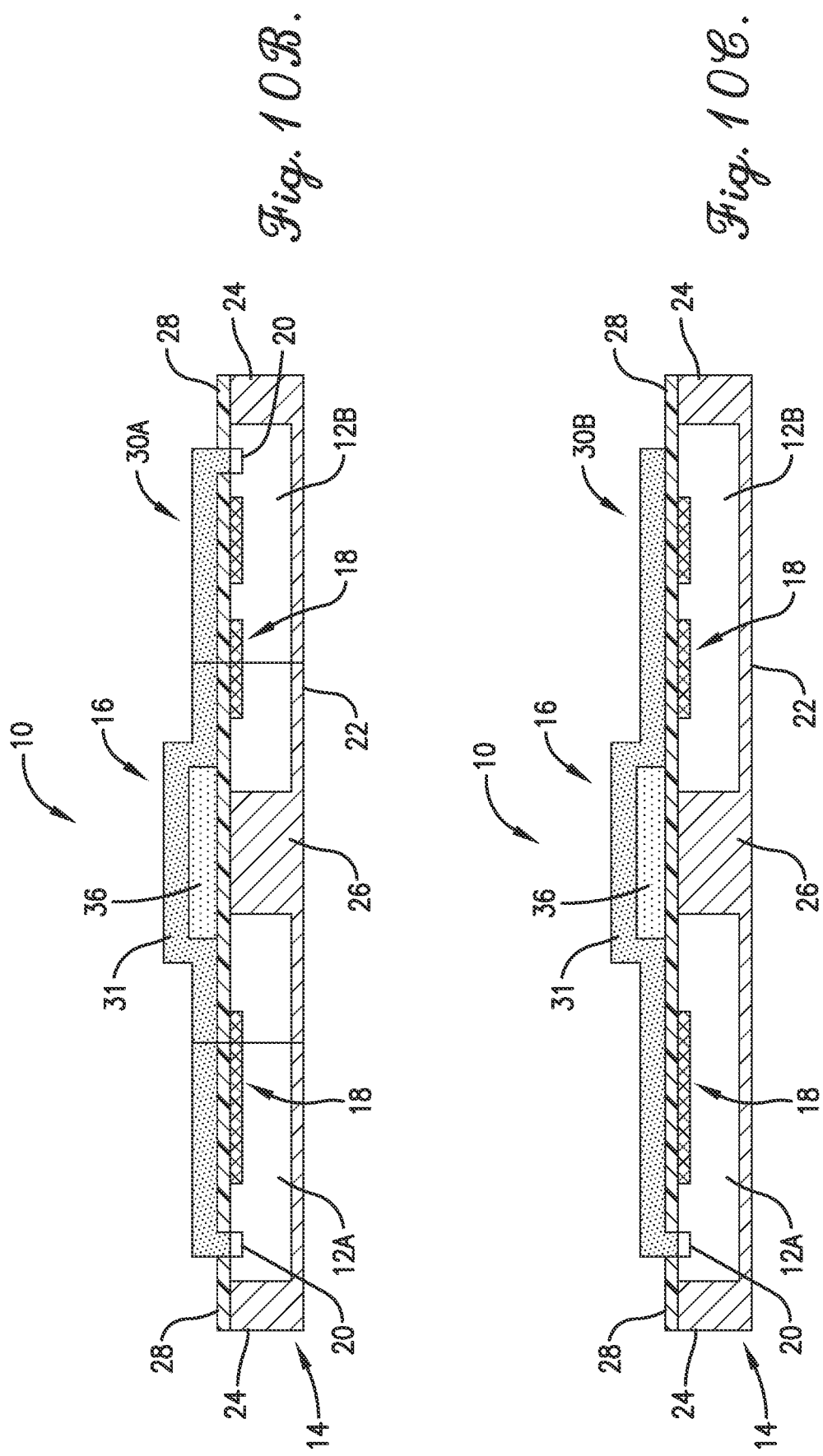

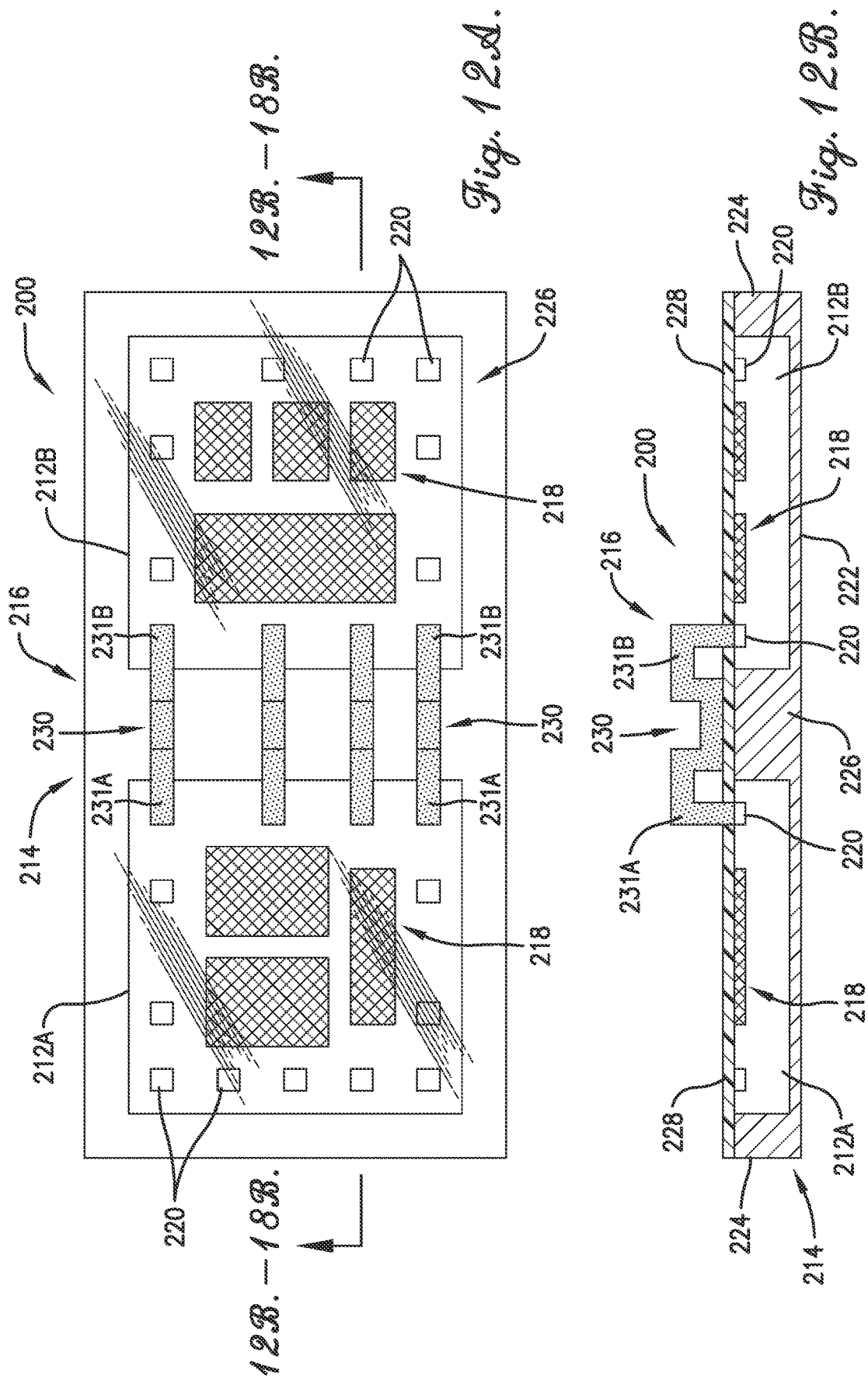

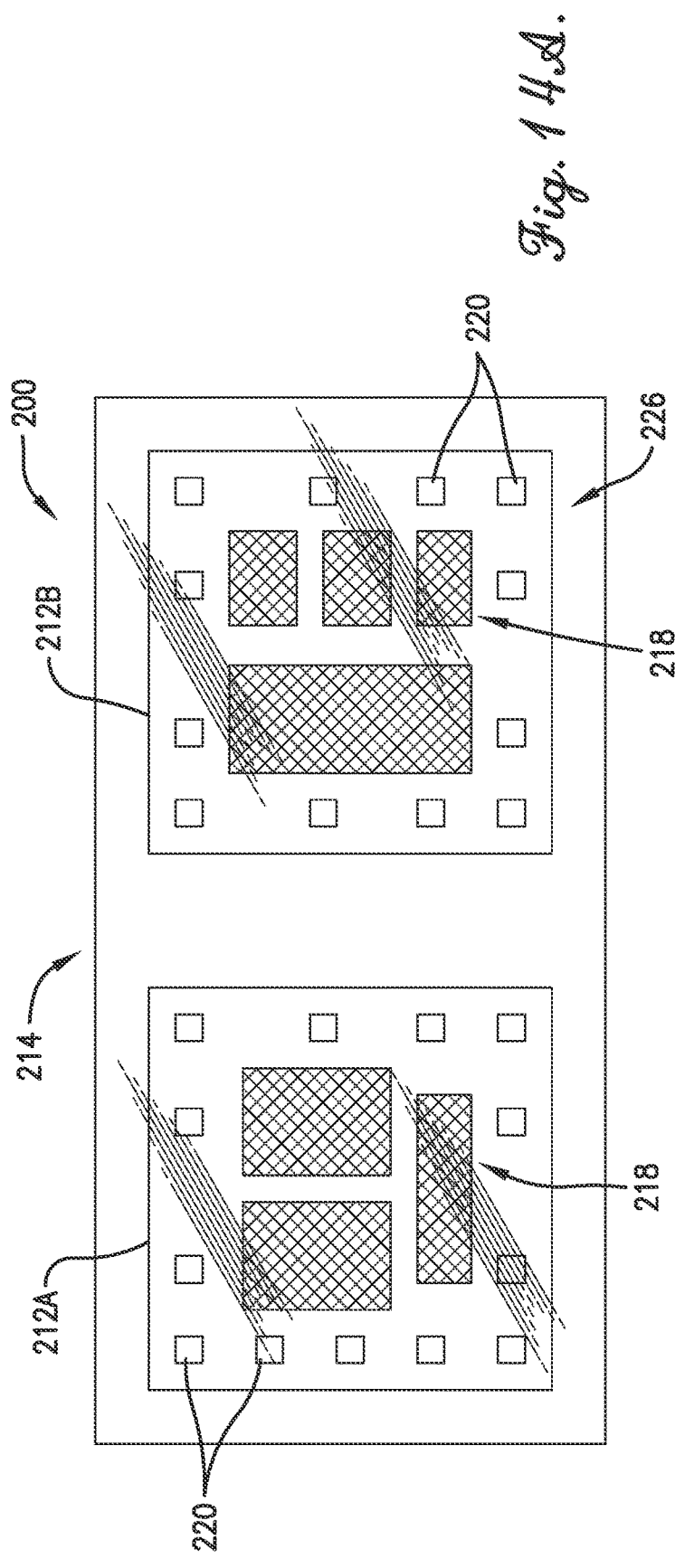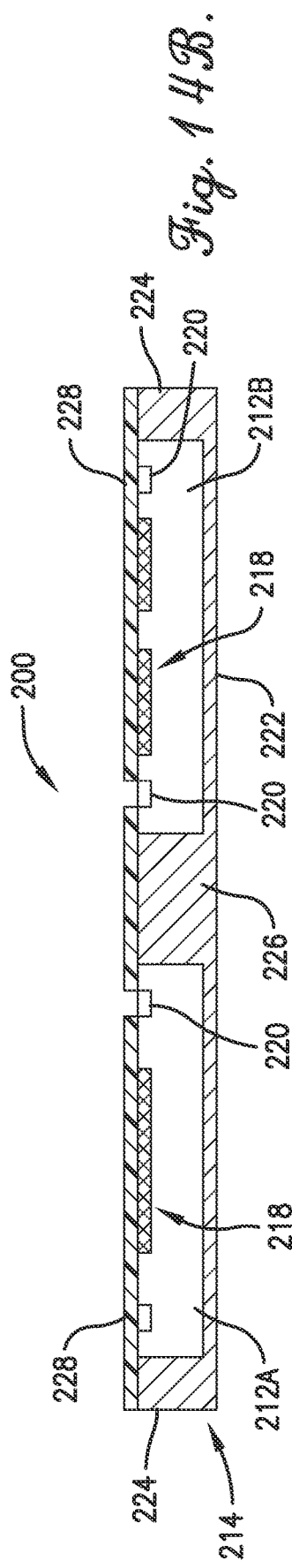

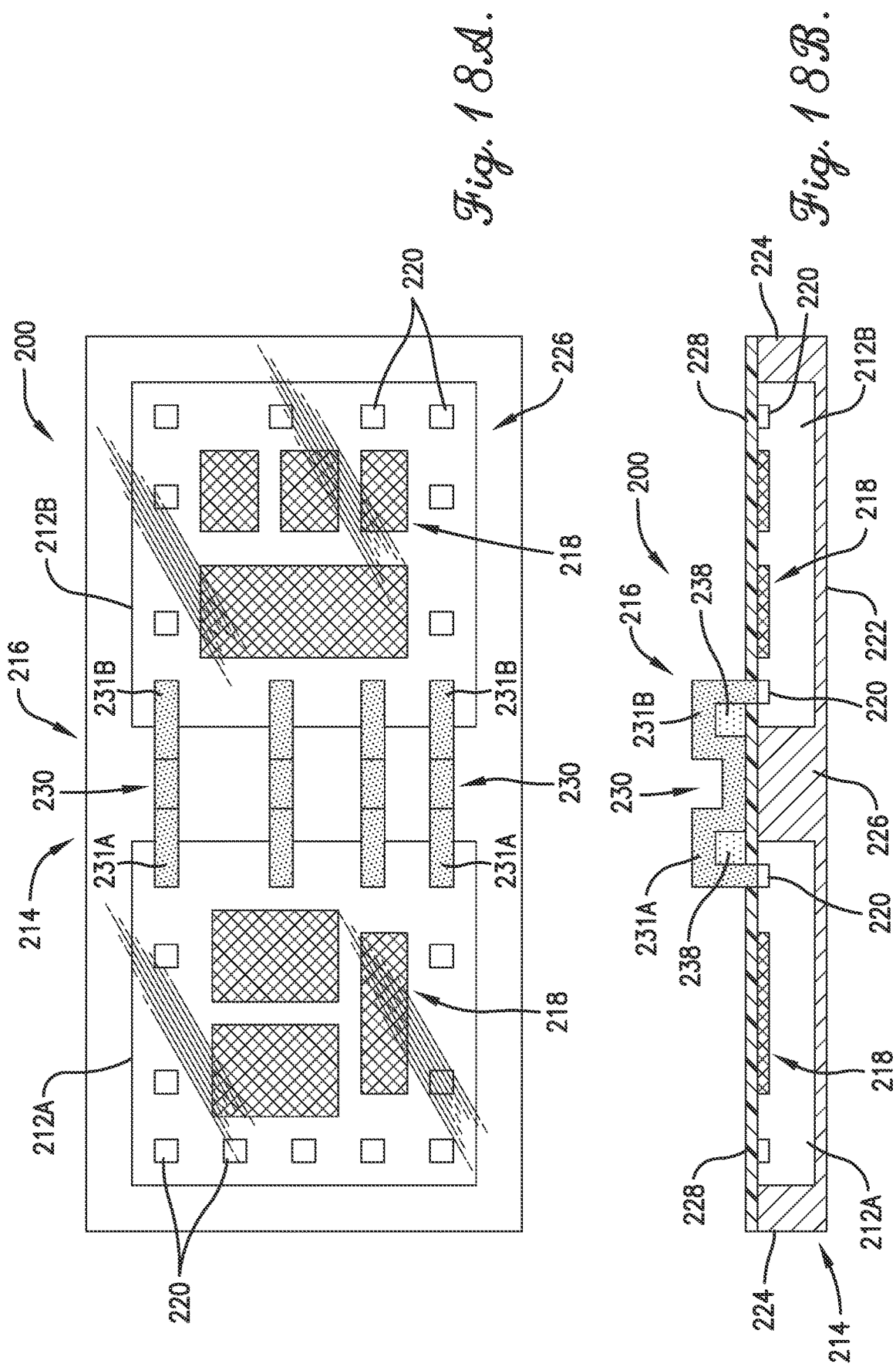

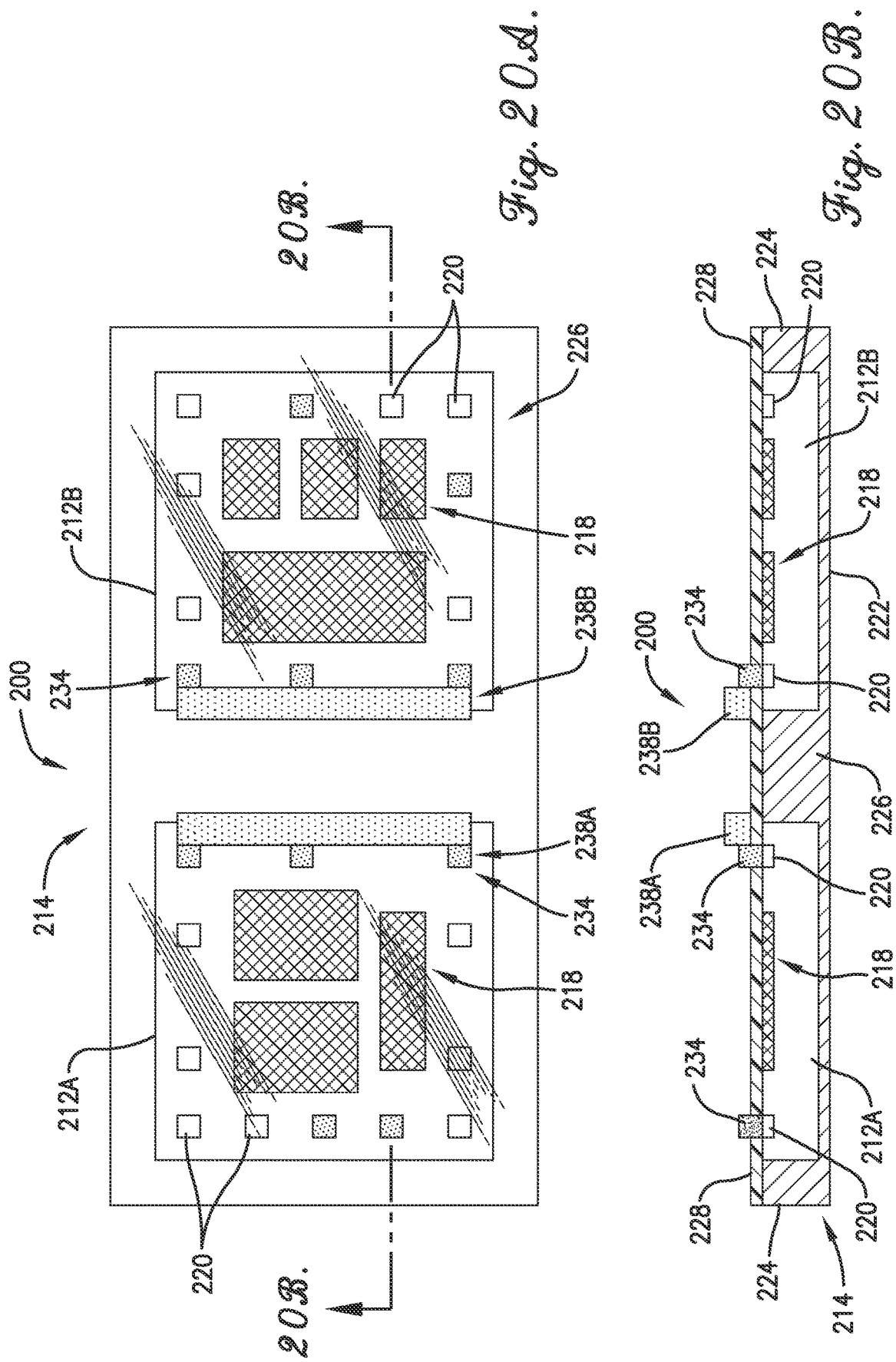

RADIO FREQUENCY TUNING USING A MULTICHIP MODULE ELECTRICAL INTERCONNECT STRUCTURE

CROSS-REFERENCE TO RELATED APPLICATIONS

The current patent application is a continuation patent application which claims priority benefit, with regard to all common subject matter, of earlier-filed U.S. patent application Ser. No. 17/511,054; titled "RADIO FREQUENCY TUNING USING A MULTICHIP MODULE ELECTRICAL INTERCONNECT STRUCTURE"; and filed Oct. 26, 2021. The earlier-filed patent application is hereby incorporated by reference, in its entirety, into the current patent application.

STATEMENT REGARDING FEDERALLY-SPONSORED RESEARCH OR DEVELOPMENT

This invention was made with Government support under Contract No.: DE-NA-0002839 awarded by the United States Department of Energy/National Nuclear Security Administration. The Government has certain rights in the invention.

FIELD OF THE INVENTION

Embodiments of the current invention relate to tuning of radio frequency wireless communication circuitry and adjustment of impedance wired communication buses on die in a multichip module.

DESCRIPTION OF THE RELATED ART

Multichip modules typically include a plurality of chips, or die, positioned within a carrier package. Each chip includes a plurality of bond pads through which signals are communicated and electric power is supplied. The chips are spaced apart from one another and held in place by a non-metal mold that fills the gaps between the chips. In some instances, one or more of the chips may include radio frequency (RF) wireless communication circuitry which transmit and receive wireless signals using protocols such as cellular telecom, Bluetooth, WiFi, and the like. The circuitry, including drivers and antennas, may need to have their resonant frequencies adjusted, i.e., tuned.

In other instances, the multichip module may include one or more wired high-speed data or communication buses, such as high-speed USB buses, high-speed PCI buses, high-speed I/O ports, network interface ports (e.g., ethernet), and the like, as well as external clocks for computer CPUs. The buses may be implemented between chips within the multichip module or may provide communication to other elements external to the multichip module. The buses may have transmission line characteristics and may require controlled impedance components at each end of the buses.

In order to tune the resonant frequency of the circuitry or adjust the impedance of components, multichip module architectures often utilize bond wires since bond wires behave like inductors—a common tuning or adjustment element. The tuning or adjustment generally involves the inclusion of a plurality of bond wires, with each bond wire attached to a first bond pad on a first chip and a second bond pad on a second chip. The bond wires have specifically chosen lengths and specifically chosen spacings between one another to meet a design criteria for a certain resonant frequency or impedance. At time of manufacture or testing, one or more bond wires may be cut or removed to provide a precise resonant frequency or impedance. One drawback to this approach is that bond wires require a minimum spacing between adjacent wires that is relatively large. Thus, it takes a lot of space on the multichip module to implement RF tuning or impedance adjustment. Furthermore, it is difficult to control the length of each bond wire, which makes it more difficult to precisely tune the resonant frequency or adjust the impedance.

SUMMARY OF THE INVENTION

Embodiments of the current invention address one or more of the above-mentioned problems and provide a method for tuning a resonant frequency of wireless communication circuitry or adjusting an impedance of wired buses on a multichip module including a plurality of chips. The method makes use of interconnect traces instead of bond wires. The interconnect traces require less space in between adjacent traces. In addition, the parameters of each interconnect trace, including its length, can be more accurately controlled to better provide precision tuning of the resonant frequency of the wireless communication circuitry. The method broadly comprises determining a length and a center to center spacing for each of a plurality of interconnect traces; determining a plurality of bond pad locations, each bond pad being located at one of opposing ends of a successive one of the interconnect traces; applying an electrical insulator to an upper surface of the multichip module; creating a plurality of openings in the electrical insulator, each opening being positioned at a successive one of the bond pads to be electrically connected to create a plurality of exposed bond pads; applying metal to each exposed bond pad to form a successive one of a plurality of interconnect bases; removing a portion of the layer of photoresist to create a plurality of bridge supports, each bridge support positioned between a successive pair of interconnect bases; applying metal to each bridge support and associated interconnect bases to form a successive one of the interconnect traces; removing the bridge supports; and disconnecting one or more of the interconnect traces as necessary to obtain a target resonant frequency.

Another embodiment provides a method for tuning a resonant frequency of wireless communication circuitry on a multichip module including a plurality of chips which broadly comprises determining a length and a center to center spacing for each of a plurality of interconnect traces, each interconnect trace electrically connected to a first bond pad on a first chip and a second bond pad on a second chip; determining a plurality of bond pad locations, each bond pad being located at one of opposing ends of a successive one of the interconnect traces; applying an electrical insulator to an upper surface of the multichip module; creating a plurality of openings in the electrical insulator, each opening being positioned at a successive one of the bond pads to be electrically connected to create a plurality of exposed bond pads; applying metal to each exposed bond pad to form a successive one of a plurality of interconnect bases; removing a portion of the layer of photoresist to create a plurality of bridge supports, each bridge support positioned between a successive pair of interconnect bases; applying metal to each bridge support and associated interconnect bases to form a successive one of the interconnect traces; removing the bridge supports; operating the wireless communication circuitry; and disconnecting one or more of the interconnect traces as necessary to obtain a target resonant frequency.

Yet another embodiment provides a method for tuning a resonant frequency of wireless communication circuitry on a multichip module including a plurality of chips which broadly comprises determining a length and a center to center spacing for each of a plurality of interconnect traces, each interconnect trace electrically connected to a first bond pad on a first chip and a second bond pad on a second chip and including a plurality of segments physically connected to one another; determining a plurality of bond pad locations, each bond pad being located at one of opposing ends of a successive one of the interconnect traces; applying an electrical insulator to an upper surface of the multichip module; creating a plurality of openings in the electrical insulator, each opening being positioned at a successive one of the bond pads to be electrically connected to create a plurality of exposed bond pads; applying metal to each exposed bond pad to form a successive one of a plurality of interconnect bases; removing a portion of the layer of photoresist to create a plurality of bridge supports, each bridge support positioned between a successive pair of interconnect bases; applying metal to each bridge support and associated interconnect bases to form a successive one of the interconnect traces; removing the bridge supports; and disconnecting one or more of the interconnect traces as necessary to obtain a target resonant frequency.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein:

FIG. 1A is a top view of a multichip module with an improved electrical interconnect structure, constructed in accordance with various embodiments of the current invention;

FIG. 1B is a side sectional view, cut along the line 1B-7B of FIG. 1A, of the multichip module and electrical interconnect structure;

FIG. 2A is a top view of the multichip module without the electrical interconnect structure;

FIG. 2B is a side sectional view, cut along the line 1B-7B of FIG. 1A, of the multichip module without the electrical interconnect structure;

FIG. 3A is a top view of the multichip module with openings created in an electrical insulator on an upper surface of the multichip module;

FIG. 3B is a side sectional view, cut along the line 1B-7B of FIG. 1A, of the multichip module with openings created in the electrical insulator;

FIG. 4A is a top view of the multichip module with metal applied to the openings to form a plurality of interconnect bases;

FIG. 4B is a side sectional view, cut along the line 1B-7B of FIG. 1A, of the multichip module with the layer of photoresist applied to the upper surface thereof;

FIG. 6A is a top view of the multichip module with a portion of the layer of photoresist removed to create a plurality of bridge supports;

FIG. 6B is a side sectional view, cut along the line 1B-7B of FIG. 1A, of the multichip module with the portion of the layer of photoresist removed to create the bridge supports;

FIG. 7A is a top view of the multichip module with metal applied to each bridge support and associated interconnect bases to form a successive one of the interconnect traces;

FIG. 7B is a side sectional view, cut along the line 1B-7B of FIG. 1A, of the multichip module with metal applied to each bridge support and associated interconnect bases to form a successive one of the interconnect traces;

FIG. 9A is a top view of the second embodiment of the multichip module showing a first intermediate processing step;

FIG. 9B is a side sectional view, cut along the line 9B-9B of FIG. 9A, of the second embodiment of the multichip module showing the first intermediate processing step;

FIG. 10A is a top view of the second embodiment of the multichip module showing a second intermediate processing step;

FIG. 10B is a side sectional view, cut along the line 10B-10B of FIG. 10A, of the second embodiment of the multichip module showing the second intermediate processing step;

FIG. 10C is a side sectional view, cut along the line 10C-10C of FIG. 10A, of the second embodiment of the multichip module showing the second intermediate processing step;

FIG. 12A is a top view of a third embodiment of a multichip module with an improved electrical interconnect structure;

FIG. 12B is a side sectional view, cut along the line 12B-18B of FIG. 12A, of the third embodiment of the multichip module and electrical interconnect structure;

Figure 15A:
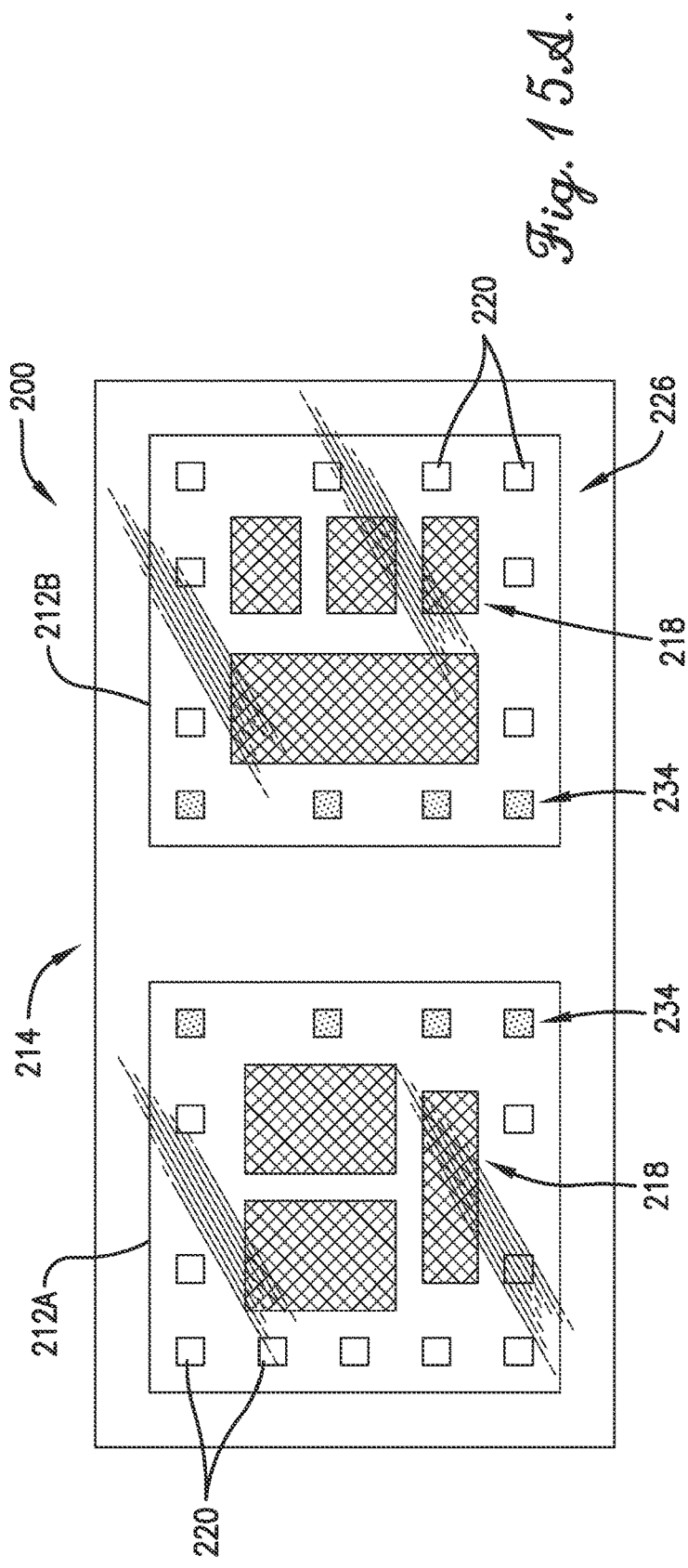
Figure 15B:
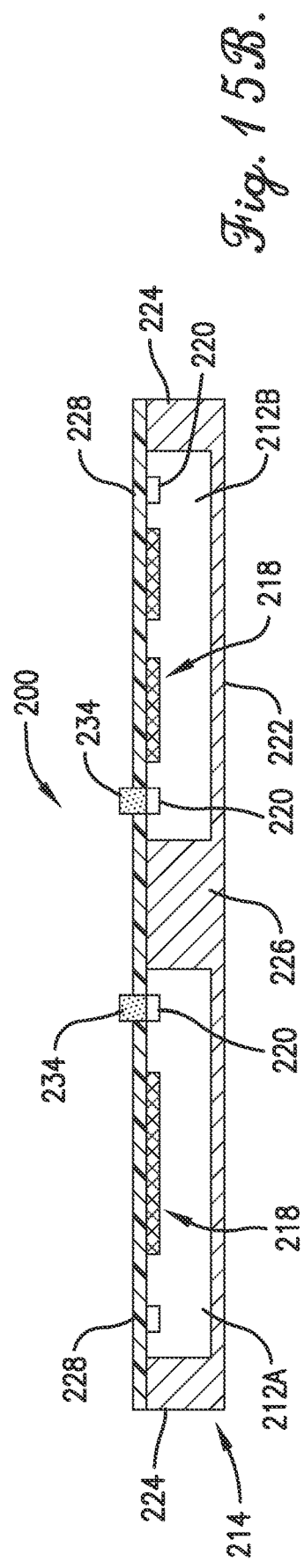
Figure 16A:
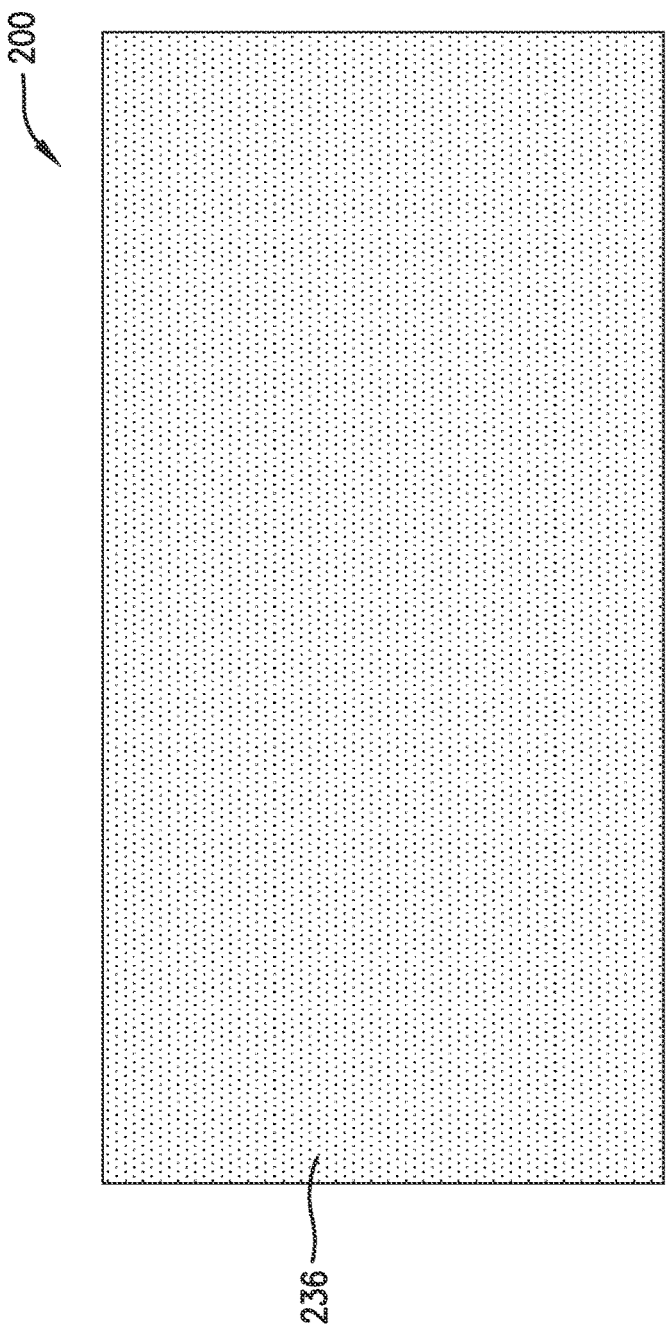
Figure 16B:
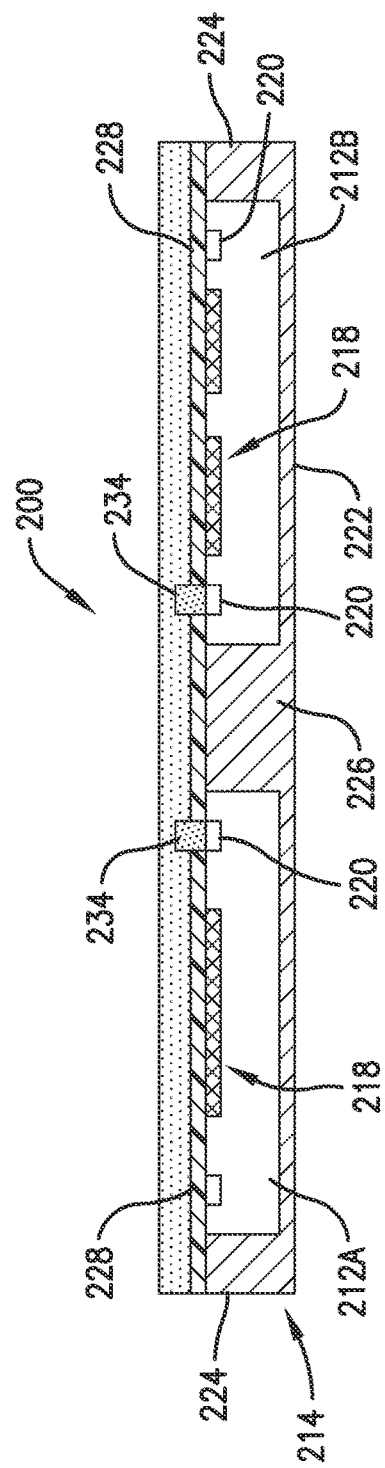
Figure 17A:
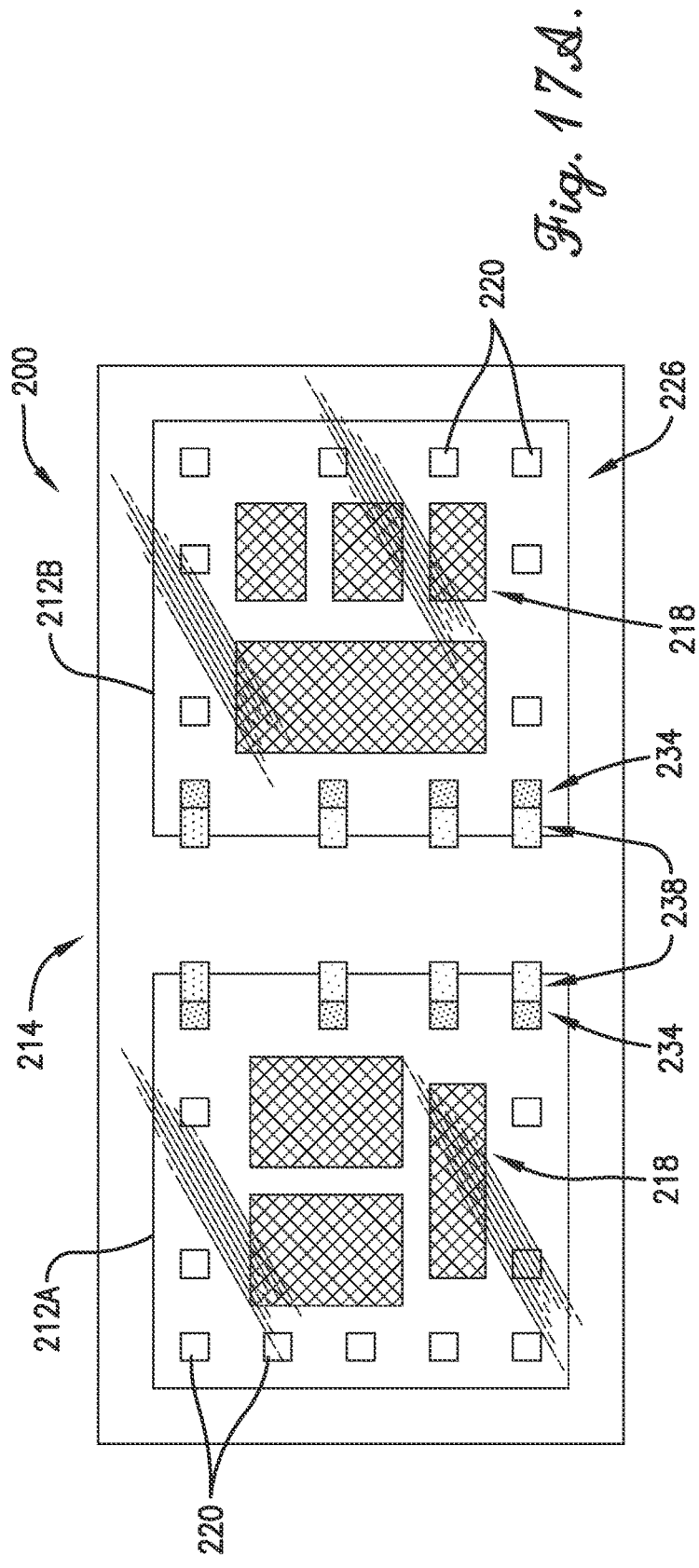
Figure 17B:
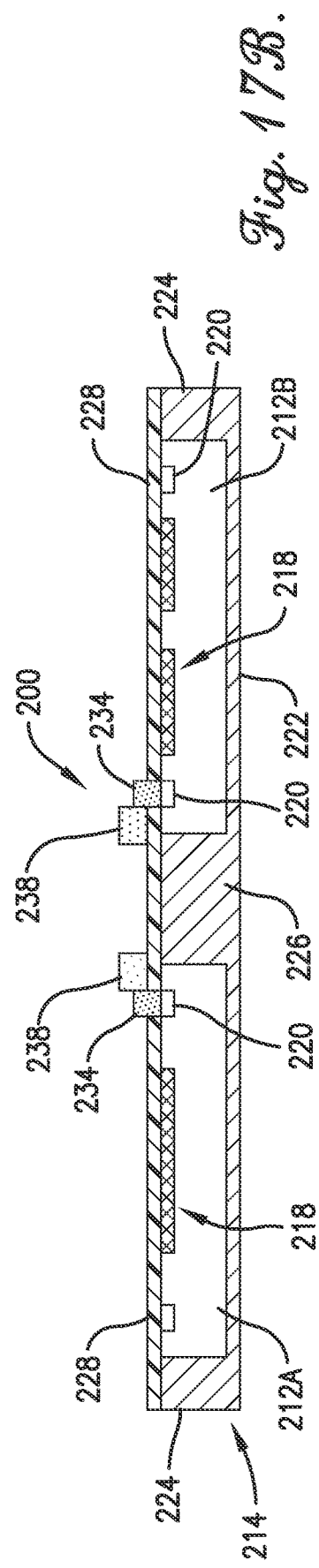
Figure 19A:
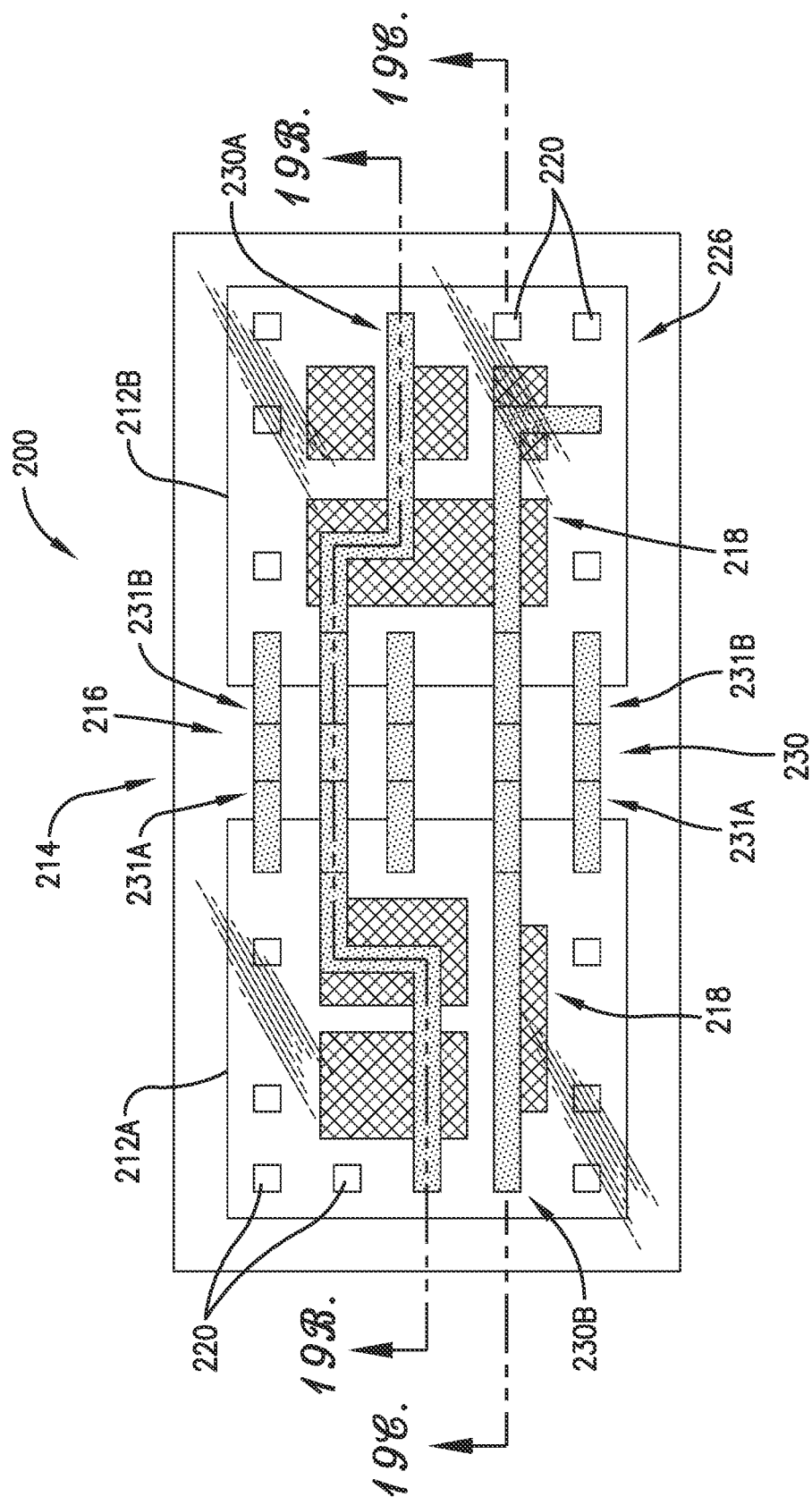
Figure 19B:
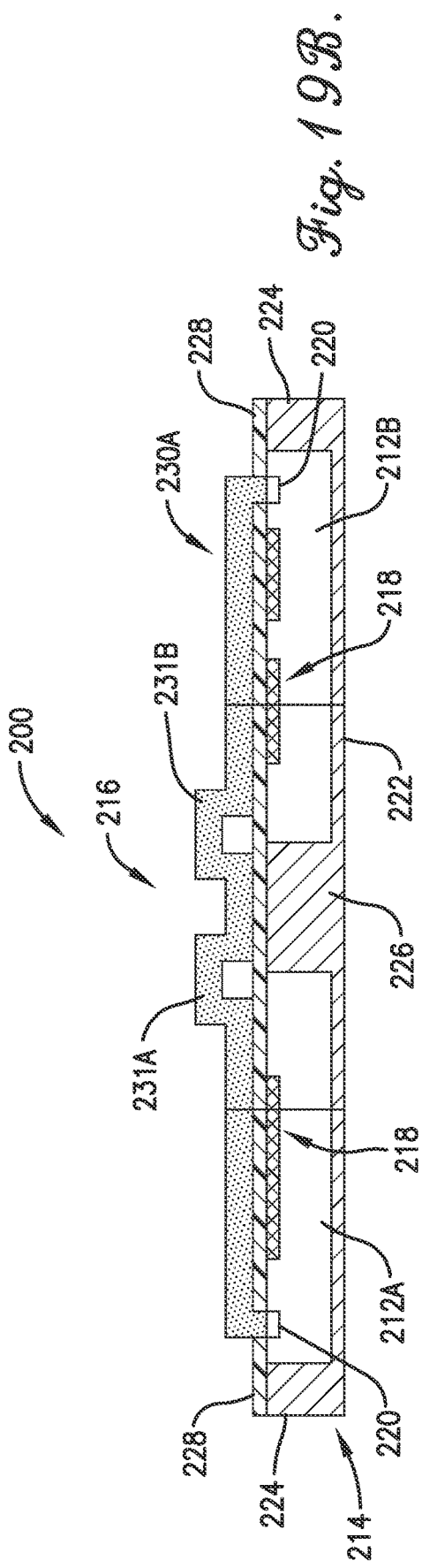
Figure 19C:
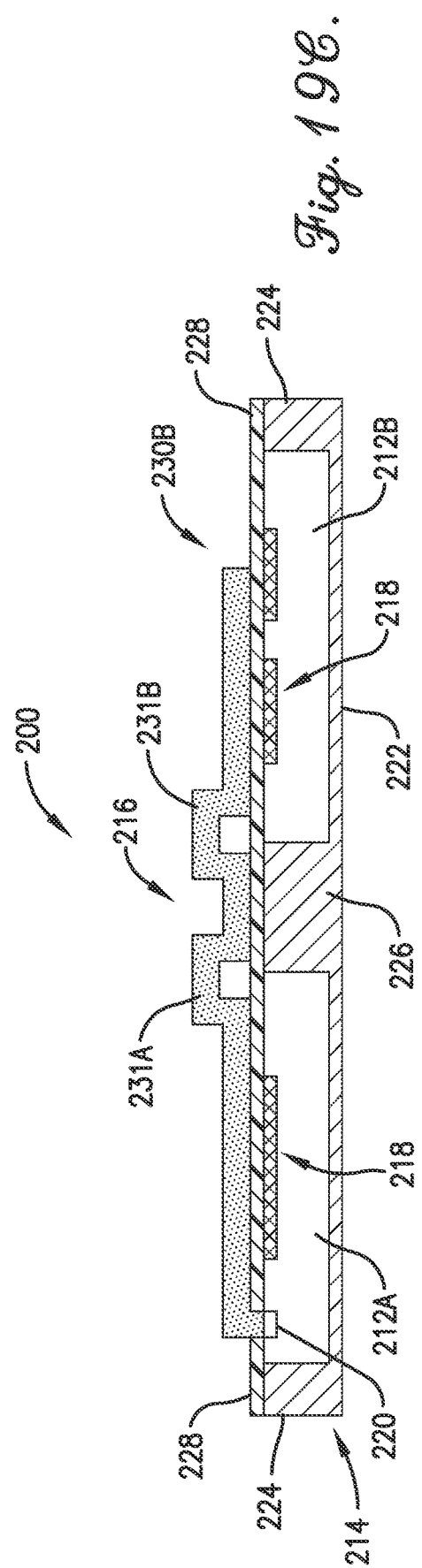
Figure 21A:
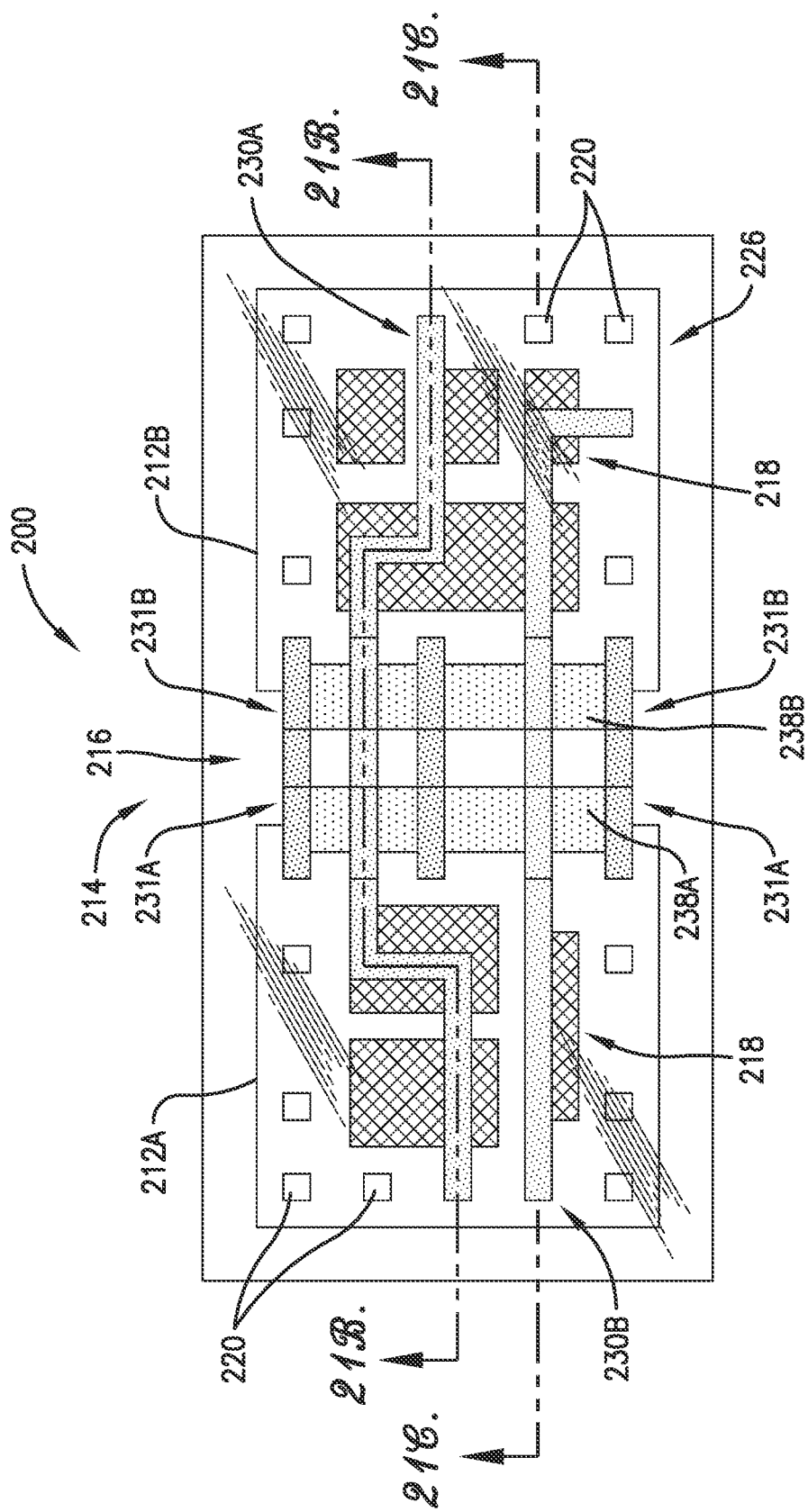
Figure 21B:
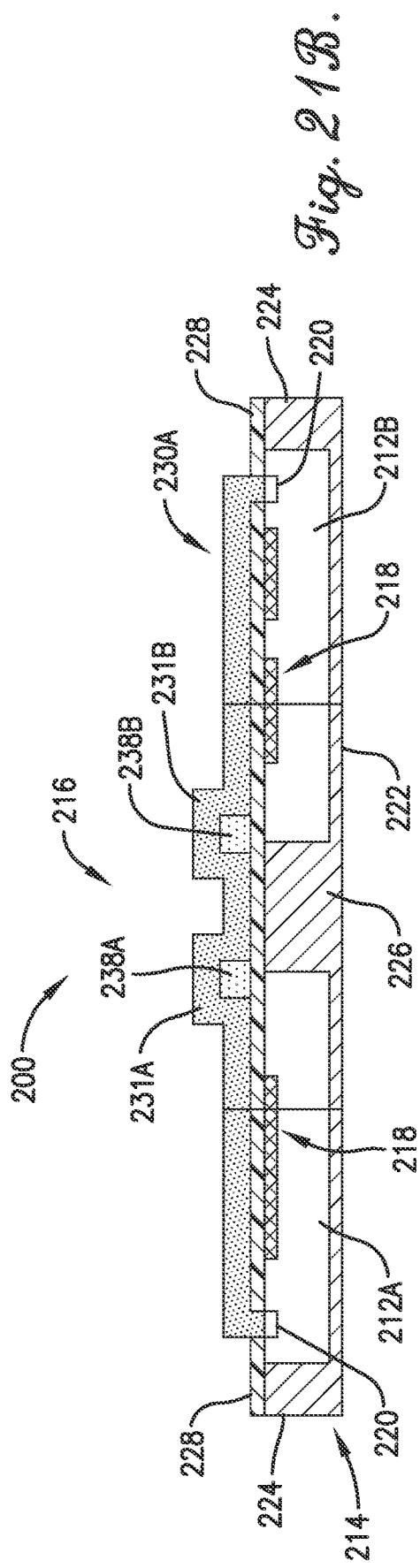
Figure 21C:
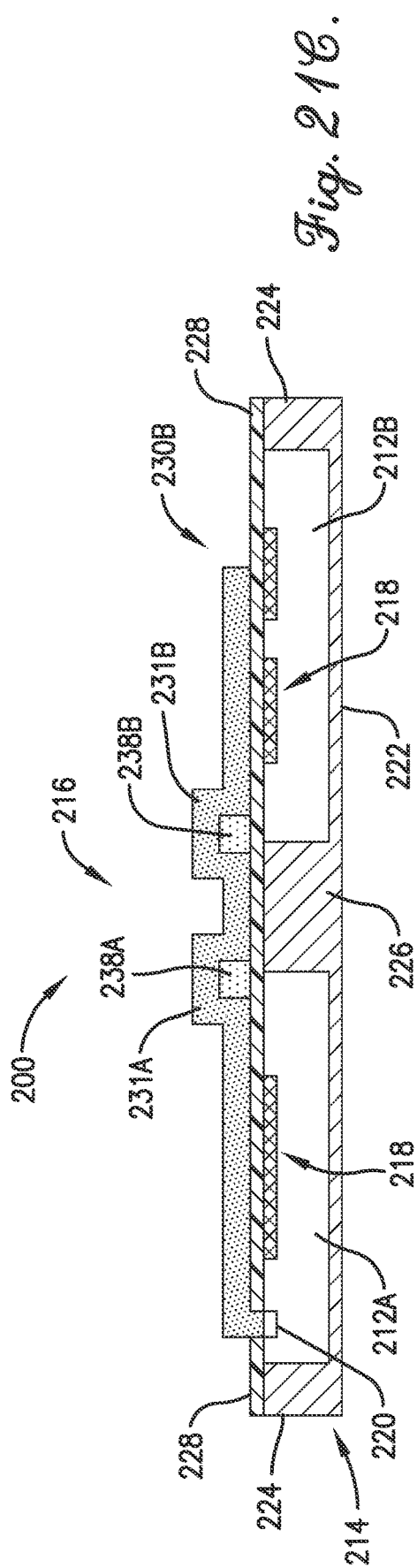
Figure 22:
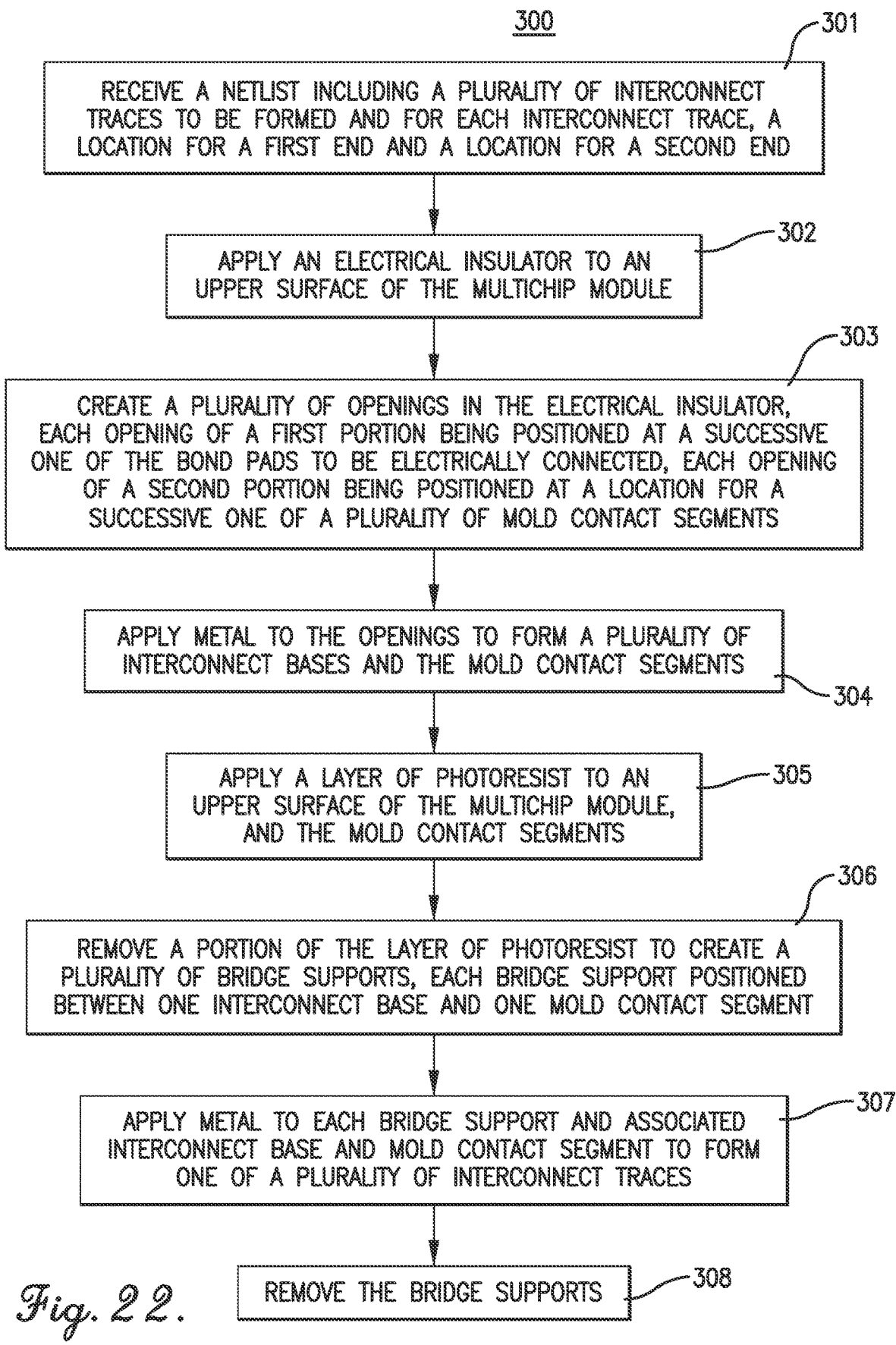
Figure 23A:
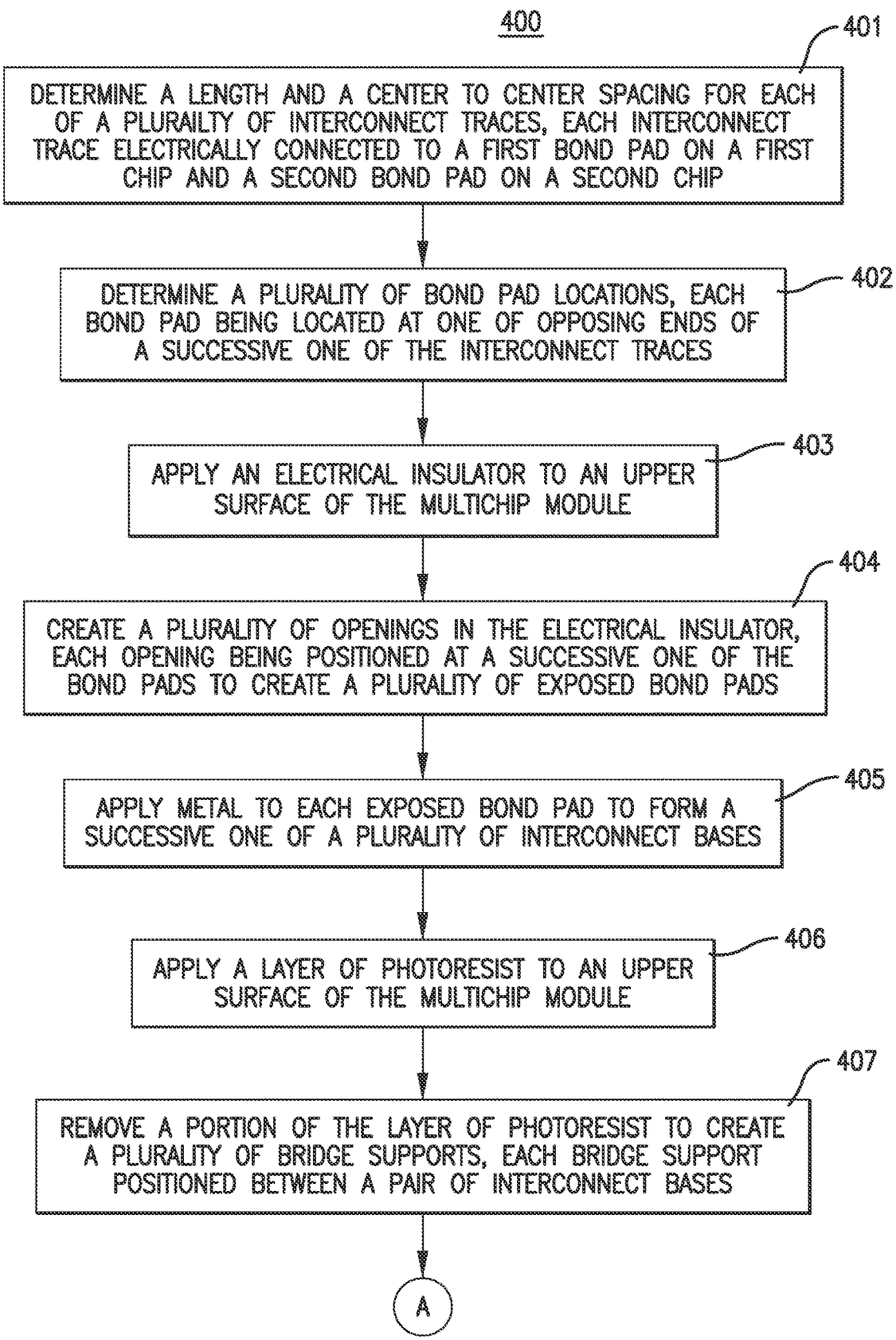
Figure 23B:
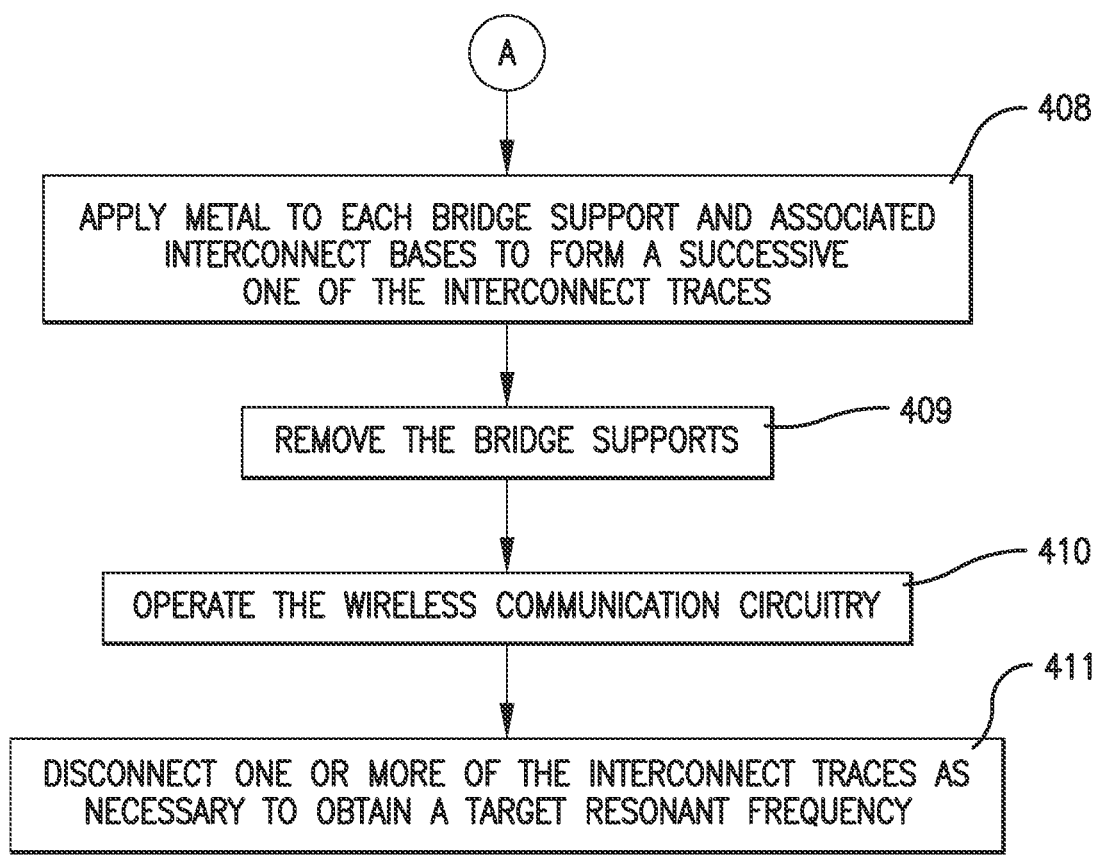
Figure 24:
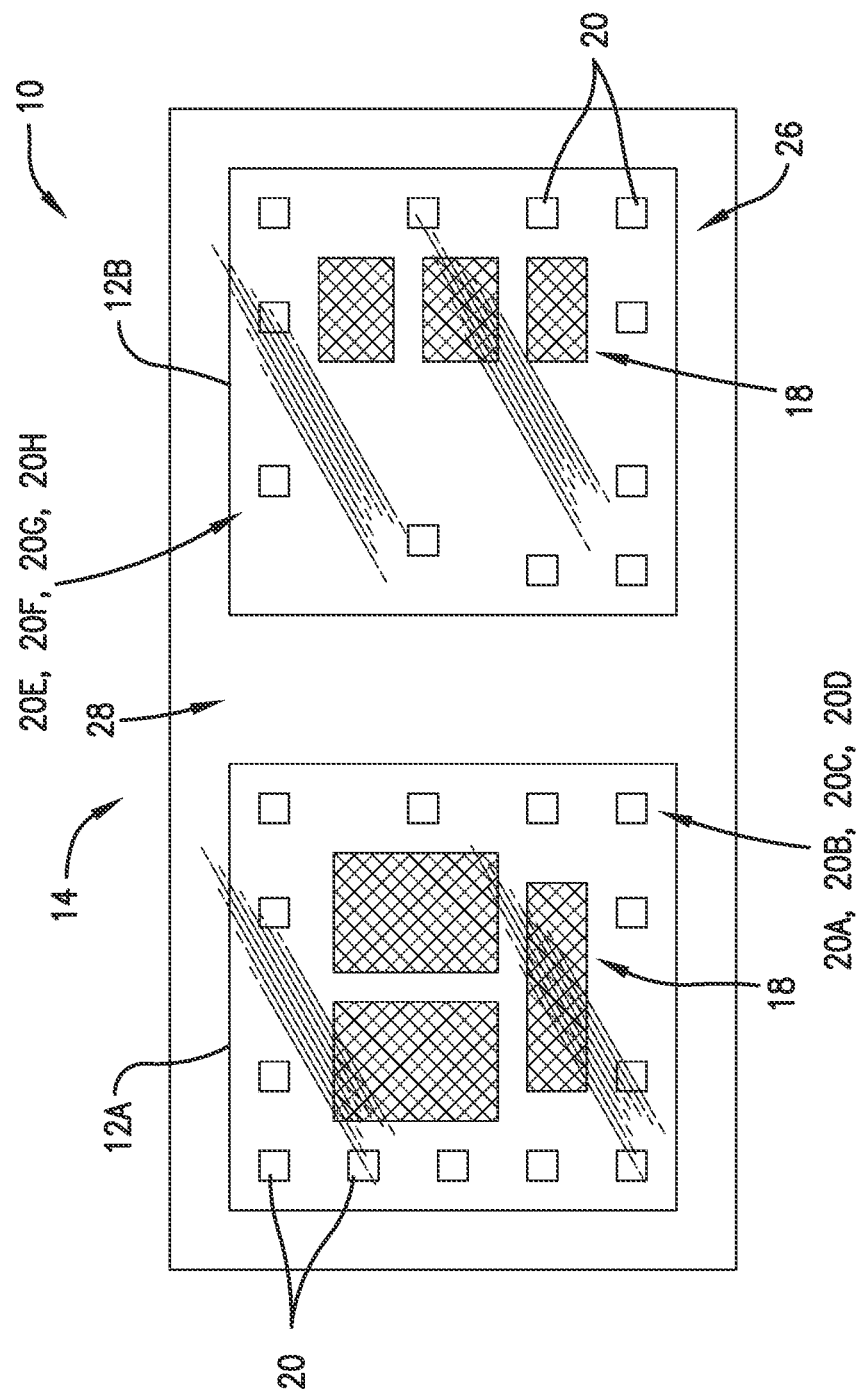
Figure 25:
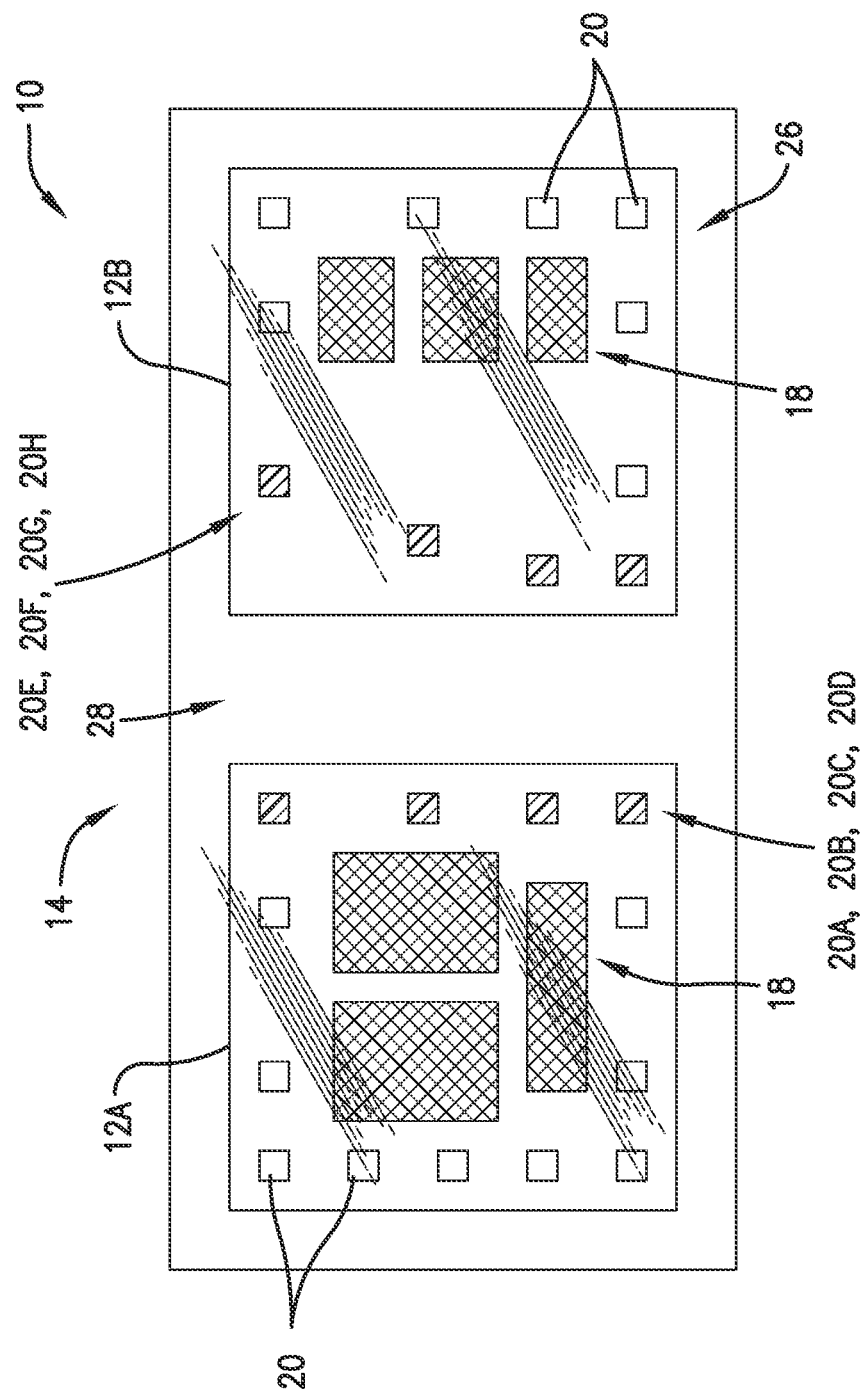
Figure 26:
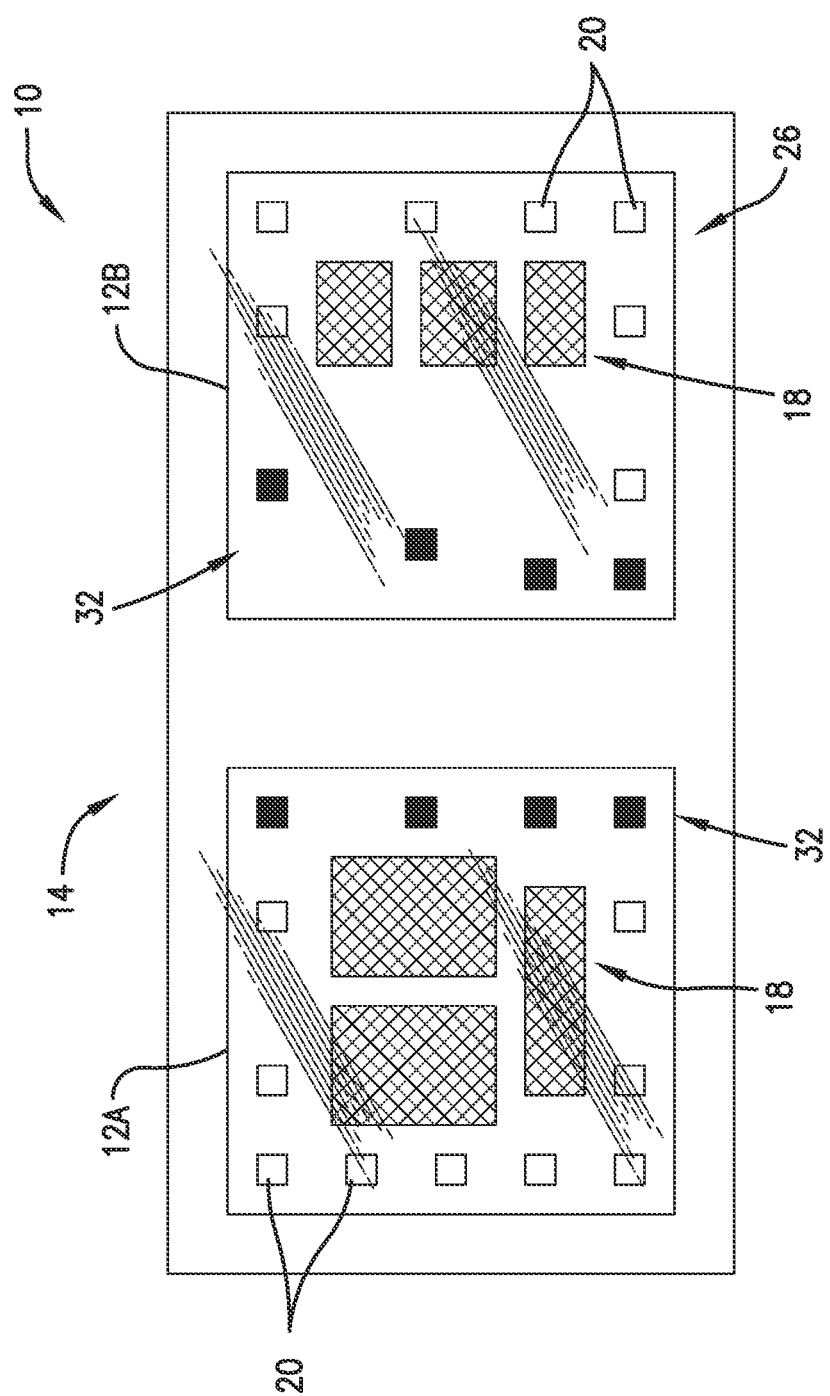
Figure 27:
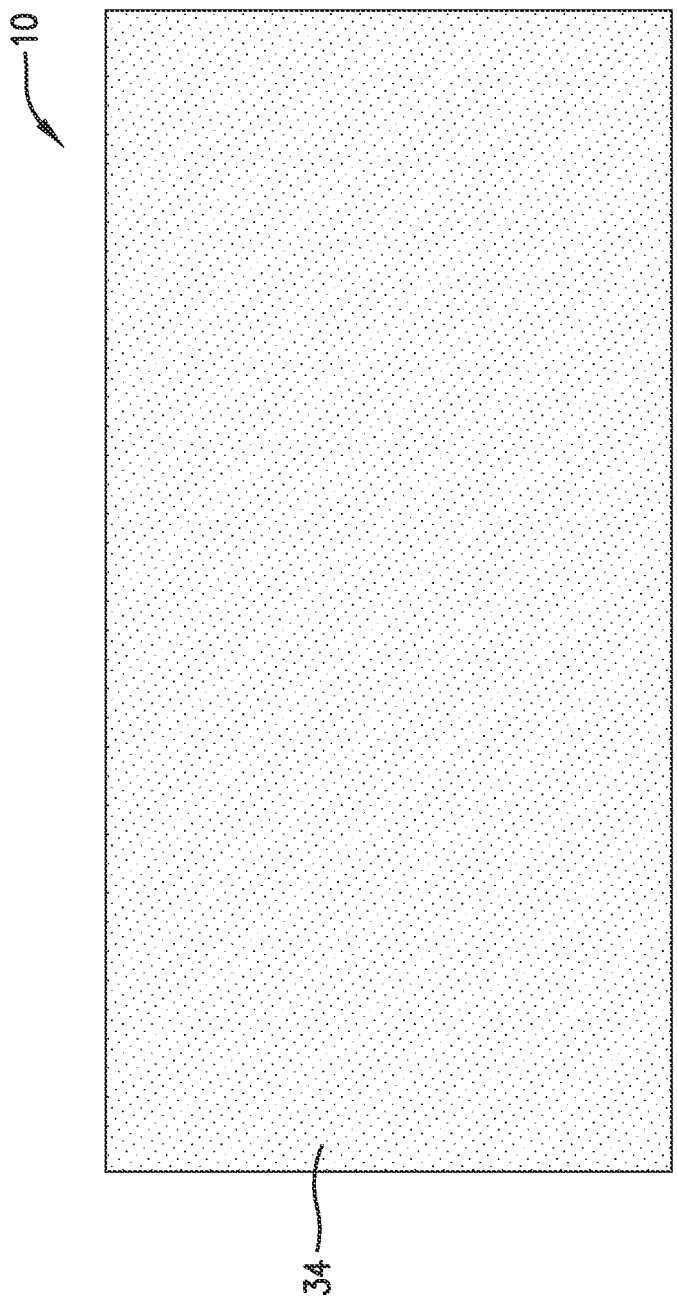
Figure 28:
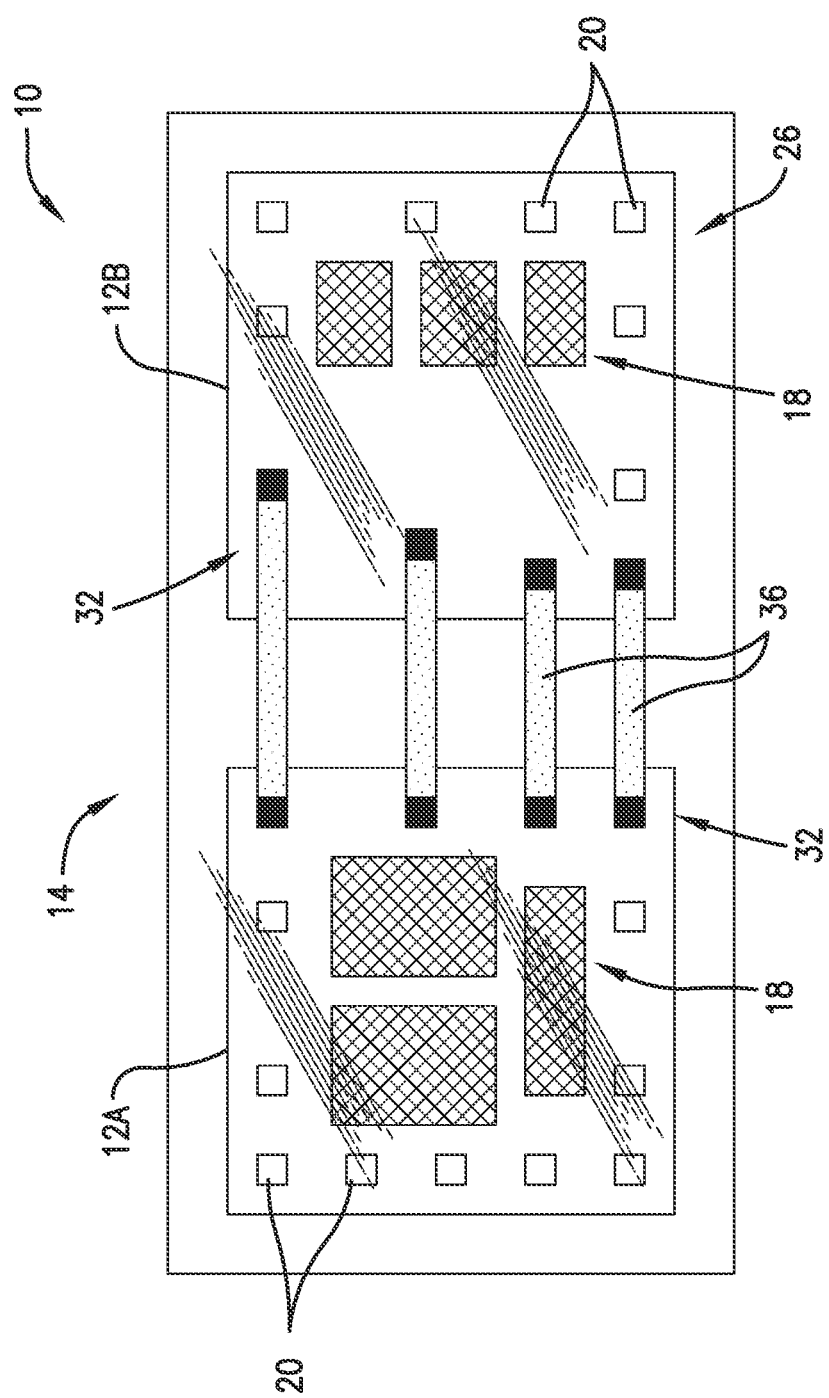
Figure 29:
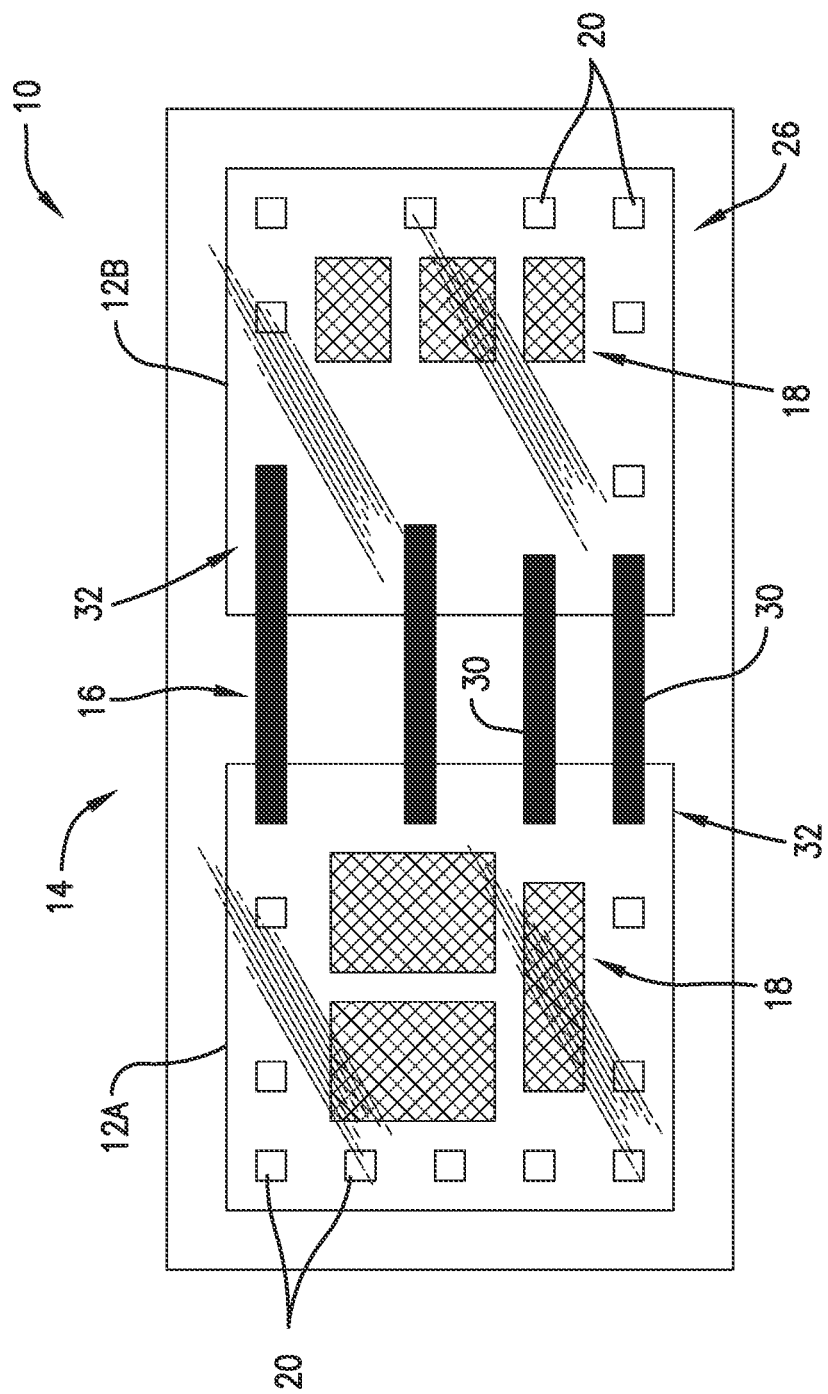
Figure 30:
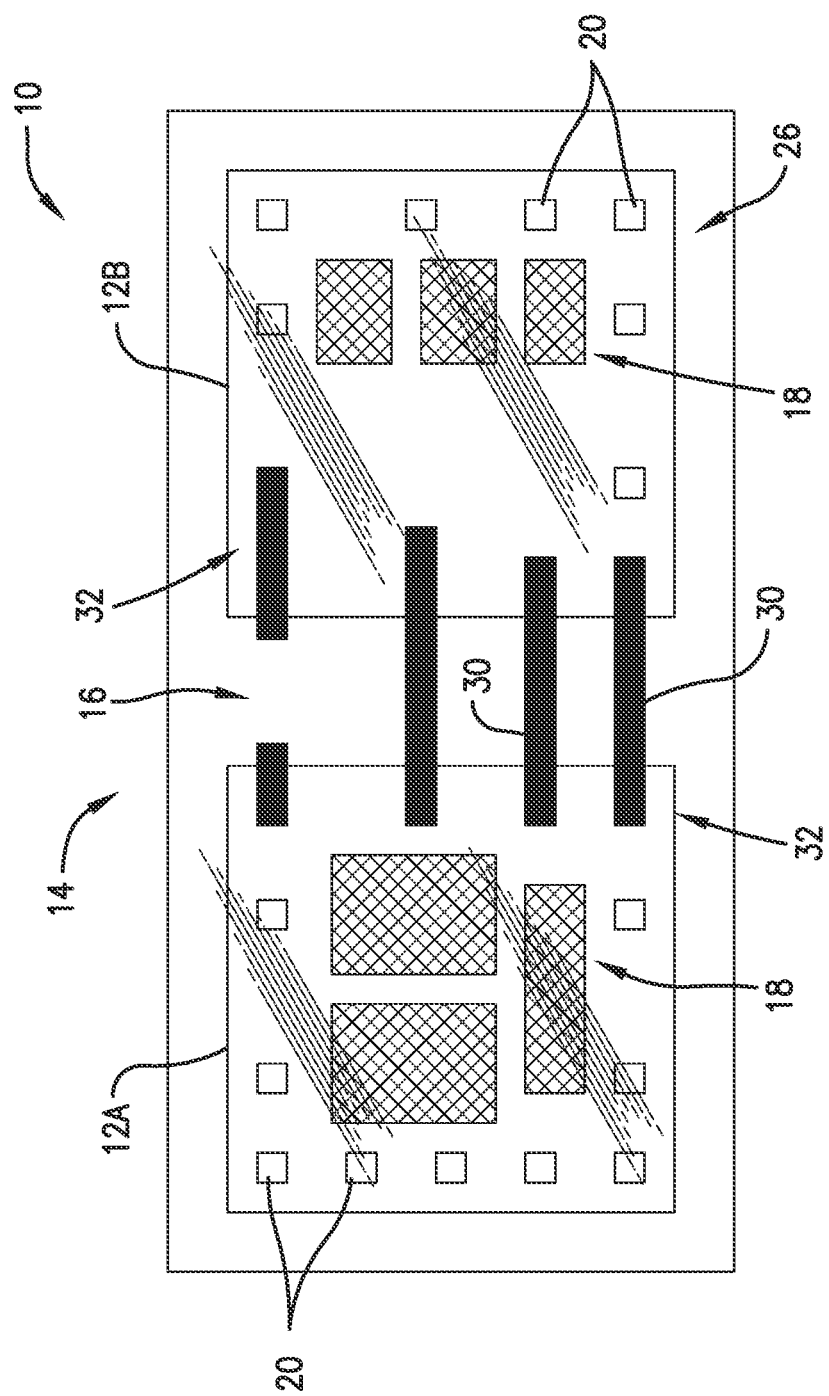

FIG. 14A is a top view of the third embodiment of the multichip module with openings created in an electrical insulator on an upper surface of the multichip module, each opening of a first portion being positioned at a successive one of the bond pads to be electrically connected, each opening of a second portion being positioned at a location for a successive one of a plurality of carrier material contact segments;

FIG. 14B is a side sectional view, cut along the line 12B-18B of FIG. 12A, of the third embodiment of the multichip module with openings created in the electrical insulator;

FIG. 15A is a top view of the third embodiment of the multichip module with metal applied to the openings to form a plurality of interconnect bases and the carrier material contact segments;

FIG. 15B is a side sectional view, cut along the line 12B-18B of FIG. 12A, of the third embodiment of the multichip module with metal applied to the openings;

FIG. 16A is a top view of the third embodiment of the multichip module with a layer of photoresist applied to the upper surface of the multichip module, the interconnect bases, and the carrier material contact segments;

FIG. 16B is a side sectional view, cut along the line 12B-18B of FIG. 12A, of the third embodiment of the multichip module with the layer of photoresist applied to the upper surface of the multichip module, the interconnect bases, and the carrier material contact segments;

FIG. 17A is a top view of the third embodiment of the multichip module with a portion of the layer of photoresist removed to create a plurality of bridge supports, each bridge support positioned between one interconnect base and one carrier material contact segment;

FIG. 17B is a side sectional view, cut along the line 12B-18B of FIG. 12A, of the third embodiment of the multichip module with a portion of the layer of photoresist removed;

FIG. 18A is a top view of the third embodiment of the multichip module with metal applied to each bridge support and associated interconnect base and carrier material contact segment to form a successive one of the interconnect traces;

FIG. 18B is a side sectional view, cut along the line 12B-18B of FIG. 12A, of the third embodiment of the multichip module with metal applied to each bridge support and associated interconnect base and carrier material contact segment;

FIG. 19A is a top view of a fourth embodiment of a multichip module with an improved electrical interconnect structure;

FIG. 19B is a side sectional view, cut along the line 19B-19B of FIG. 19A, of the fourth embodiment of the multichip module;

FIG. 19C is a side sectional view, cut along the line 19C-19C of FIG. 19A, of the fourth embodiment of the multichip module;

FIG. 20A is a top view of the fourth embodiment of the multichip module showing a first intermediate processing step;

FIG. 20B is a side sectional view, cut along the line 20B-20B of FIG. 20A, of the fourth embodiment of the multichip module showing the first intermediate processing step;

FIG. 21A is a top view of the fourth embodiment of the multichip module showing a second intermediate processing step;

FIG. 21B is a side sectional view, cut along the line 21B-21B of FIG. 21A, of the fourth embodiment of the multichip module showing the second intermediate processing step;

FIG. 21C is a side sectional view, cut along the line 21C-21C of FIG. 21A, of the fourth embodiment of the multichip module showing the second intermediate processing step;

FIG. 22 is a listing of at least a portion of the steps of a second method for forming an electrical interconnect structure for use with a multichip module;

FIGS. 23A and 23B include a listing of at least a portion of the steps of a method for tuning a resonant frequency of wireless communication circuitry on a multichip module including a plurality of chips;

FIG. 24 is a top view of a multichip module including a plurality of chips, with each chip including at least a portion of bond pads to be electrically connected with interconnect traces;

FIG. 25 is a top view of the multichip module with openings created in an electrical insulator on an upper surface of the multichip module;

FIG. 26 is a top view of the multichip module with metal applied to the openings to form a plurality of interconnect bases;

FIG. 27 is a top view of the multichip module with a layer of photoresist applied to the upper surface thereof;

FIG. 28 is a top view of the multichip module with a portion of the layer of photoresist removed to create a plurality of bridge supports;

FIG. 29 is a top view of the multichip module with metal applied to each bridge support and associated interconnect bases to form a successive one of the interconnect traces; and FIG. 30 is a top view of the multichip module with one or more interconnect traces disconnected as necessary to obtain a target resonant frequency.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

Relational terms, such as "above", "below", "upper", "upward", "downward", "lower", "top", "bottom", "outer", "inner", etc., along with orientation terms, such as "horizontal" and "vertical", may be used throughout this description. These terms are used with reference to embodiments of the technology and the positions and orientations thereof shown in the accompanying figures. Embodiments of the technology may be positioned and oriented in other ways. Therefore, the terms do not limit the scope of the present technology.

Referring to FIGS. 1A and 1B, a multichip module 10 with an improved electrical interconnection, constructed in accordance with various embodiments of the current invention, is shown in a top view and a cross-sectional view cut along a vertical plane indicated by the line 1B-7B. The multichip module 10 broadly comprises a plurality of chips 12, or die, a carrier 14, and an electrical interconnect structure 16. The electrical interconnect structure 16 may be utilized with the multichip module 10 in addition to, or instead of, redistribution layers (RDL) of electrical interconnects.

An exemplary multichip module 10, as shown in the figures, includes a first chip 12A and a second chip 12B. Greater numbers of chips 12 in the multichip module 10 are also possible. Each chip 12 includes integrated circuitry 18 that performs a function or operation. The integrated circuitry 18 may include analog circuitry, digital circuitry, or a combination of both. Each chip 12 may include one or more discrete integrated circuits 18, or the integrated circuitry 18 may include one or more discrete functional blocks or units. In addition, each chip 12 may include, or be formed on, the same type, or a different type, of substrate, such as silicon, germanium, silicon germanium, gallium arsenide, or the like. Furthermore, each chip 12 includes a plurality of bond pads 20, wherein each bond pad 20 is formed from one or more layers of electrically conductive material, such as metals or metal alloys. Each bond pad 20 provides an electrical connection to the integrated circuitry. The electrical connections include an input connection and an output connection to provide control signals and/or data communication, an electrical power connection and an electrical ground connection to provide electric power to the integrated circuitry.

The carrier 14 includes a bottom wall 22 and four side walls 24 which form a cavity within the carrier 14. The chips 12 are positioned, or placed, within the cavity of carrier 14, wherein each chip 12 is positioned in a specific location, typically with a space between adjacent chips 12 and a space between each chip 12 and the side walls 24. A carrier material 26, or compound, with electrical insulating and/or dielectric properties is added to the cavity to fill in the space around the chips 12. The material of the carrier material 26 may be actively or passively cured so that the chips 12 are fixed in their locations.

On an upper surface of each chip 12, or on an upper surface of the multichip module 10, is an electrical insulating layer 28, which may be formed from electrically insulating materials, such as glass, polyimide, or the like.

Referring to FIGS. 1A and 1B, the electrical interconnect structure 16 includes a plurality of interconnect traces 30, with each interconnect trace 30 electrically connecting one bond pad 20 on one chip 12 to one bond pad 20 on another chip 12. The exemplary embodiment of the interconnect structure 16 shown in FIGS. 1A and 1B includes four interconnect traces 30. Each interconnect trace 30 is formed from electrically conductive materials, such as metals and/or metal alloys. Exemplary metals include aluminum, titanium, copper, gold, nickel, palladium, and the like. In addition, the metal and/or metal alloy may be passivated by utilizing a passivation process. Furthermore, the metal and/or metal alloy may be a thin film metal. With reference to FIG. 1B, each interconnect trace 30 includes a first end electrically connected to a first bond pad 20 on the first chip 12A, an opposing second end electrically connected to a second bond pad 20 on the second chip 12B, and a bridge 31 therebetween. The bridge 31 extends away from, is spaced apart from, and is positioned above, other portions of the first chip 12A and the second chip 12B and from the electrical insulating layer 28, or any other portion, of the carrier 14. Each bridge 31 may include a first segment, a second segment, and a third segment. The first segment is generally vertically oriented. The second segment is physically and electrically connected to the first segment and is generally horizontally oriented. The third segment is physically and electrically connected to the second segment and is generally vertically oriented. The first and third segments are electrically connected to the bond pads 20. Since the bridge 31 of the interconnect trace 30 does not contact the carrier material 26, the interconnect trace 30 may resiliently flex and not break as the carrier material 26 contracts and expands due to changes in temperature.

In other embodiments, the segments of each bridge 31 may not connect to one another at roughly ninety-degree angles as shown in FIG. 1B. The segments of each bridge 31 may connect to one another such that they are less orthogonal and more rounded, arched, or arcuate.

Although the bridges 31 are shown in the figures as having a uniform width, a uniform thickness, and a uniform height above the electrical insulating layer 28, some bridges 31 may have a different width compared to the width of other bridges 31. Some bridges 31 may have a different thickness compared to the thickness of other bridges 31. And, some bridges 31 may have a different height compared to the height of other bridges 31. In addition, some bridges 31 may have a variable width, wherein the width varies by location on the bridge 31 or other factors. For example, a midpoint of the bridge 31 may be wider or narrower than the endpoints of the bridge 31. Some bridges 31 may have a variable thickness, wherein the thickness varies by location on the bridge 31 or other factors. For example, the midpoint of the bridge 31 may be thicker or thinner than the endpoints of the bridge 31. Some bridges 31 may have a variable height, wherein the height varies by location on the bridge 31 or other factors. For example, the midpoint of the bridge 31 may be farther from, or closer to, the electrical insulating layer 28 than the endpoints of the bridge 31.

Figure 8A:
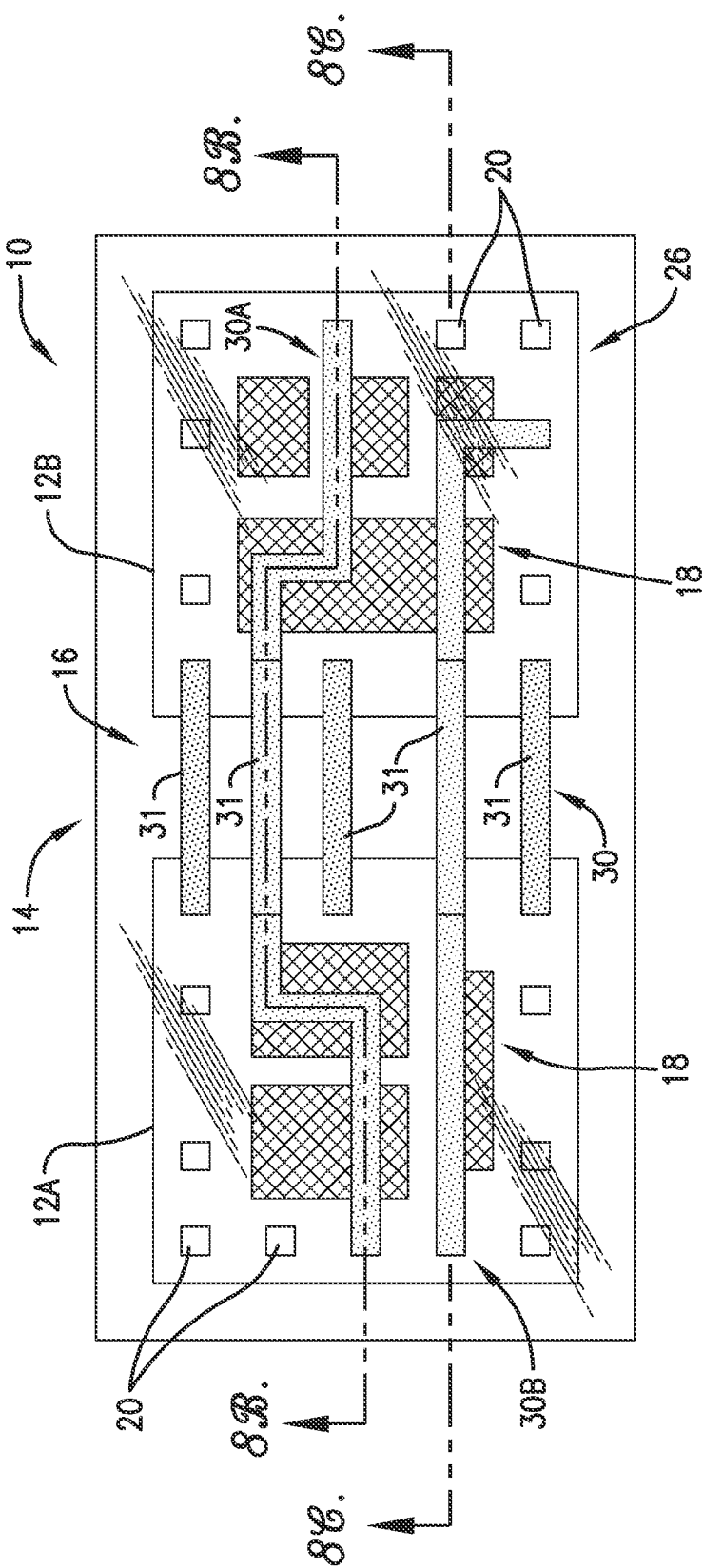
FIG. 8A is a top view of a second embodiment of a multichip module with an improved electrical interconnect structure.
Figure 8B:
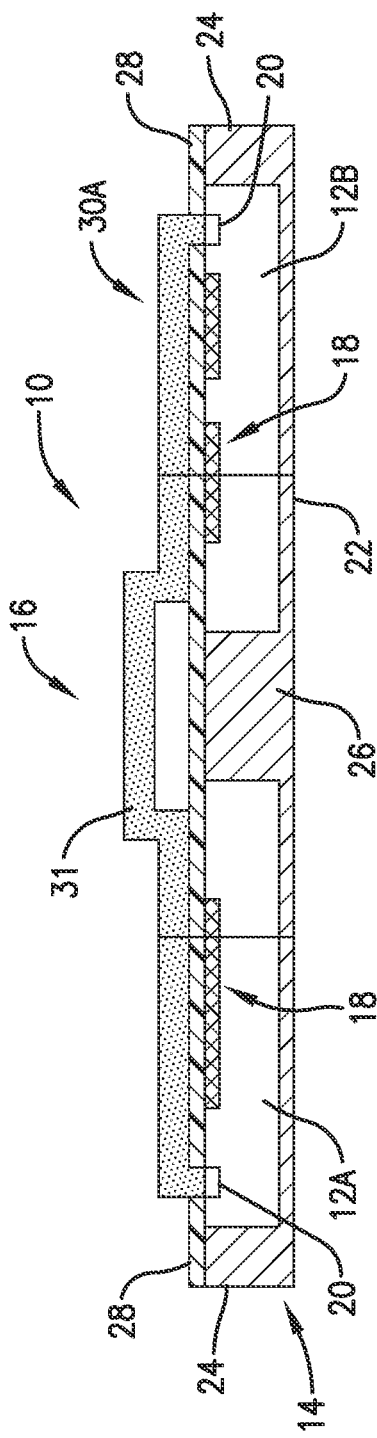
FIG. 8B is a side sectional view, cut along the line 8B-8B of FIG. 8A, of the second embodiment of the multichip module.
Figure 8C:
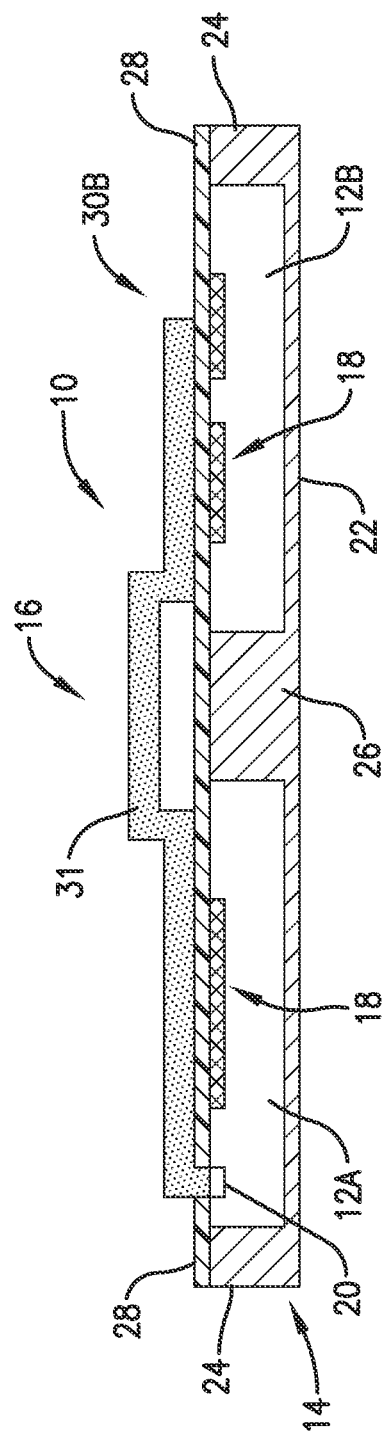
FIG. 8C is a side sectional view, cut along the line 8C-8C of FIG. 8A, of the second embodiment of the multichip module.

Referring to FIGS. 8A, 8B, and 8C, other embodiments of the interconnect structure 16 include interconnect traces 30 that electrically connect bond pads 20 which are not directly aligned with one another across a carrier material 26 channel between adjacent chips 12A, 12B. For example, the interconnect structure 16 includes two interconnect traces 30 that each electrically connect a bond pad 20 on the first chip 12A to a bond pad 20 on the second chip 12B, wherein the bond pads 20 on the first chip 12A are not directly aligned across the carrier material 26 channel with the bond pads 20 on the second chip 12B. (The interconnect structure 16 also includes three interconnect traces 30 for which the bond pads 20 on the first chip 12 are directly aligned with the bond pads 20 on the second chip 12B.) In such embodiments, some interconnect traces 30 include segments that are positioned on an upper surface of, and in contact with, the electrical insulating layer 28, as shown in FIGS. 8B and 8C. For example, a first interconnect trace 30A and a second interconnect trace 30B that connect bond pads 20 not directly aligned with one another each include one or more segments that electrically connect the first bond pad 20 to one end of the bridge 31 and one or more segments that electrically connect the second bond pad 20 to the other end of the bridge 31. Those segments are positioned on the upper surface of, and in contact with, the electrical insulating layer 28. In addition, one or more interconnect traces 30 may be routed to avoid other interconnect traces 30. The first interconnect trace 30A and the second interconnect trace 30B each include segments that change directions on the surface of the electrical insulating layer 28 in order to avoid other interconnect traces 30, such as those which electrically connect bond pads 20 directly across the carrier material 26 channel between adjacent chips 12A, 12B.

Figure 11:
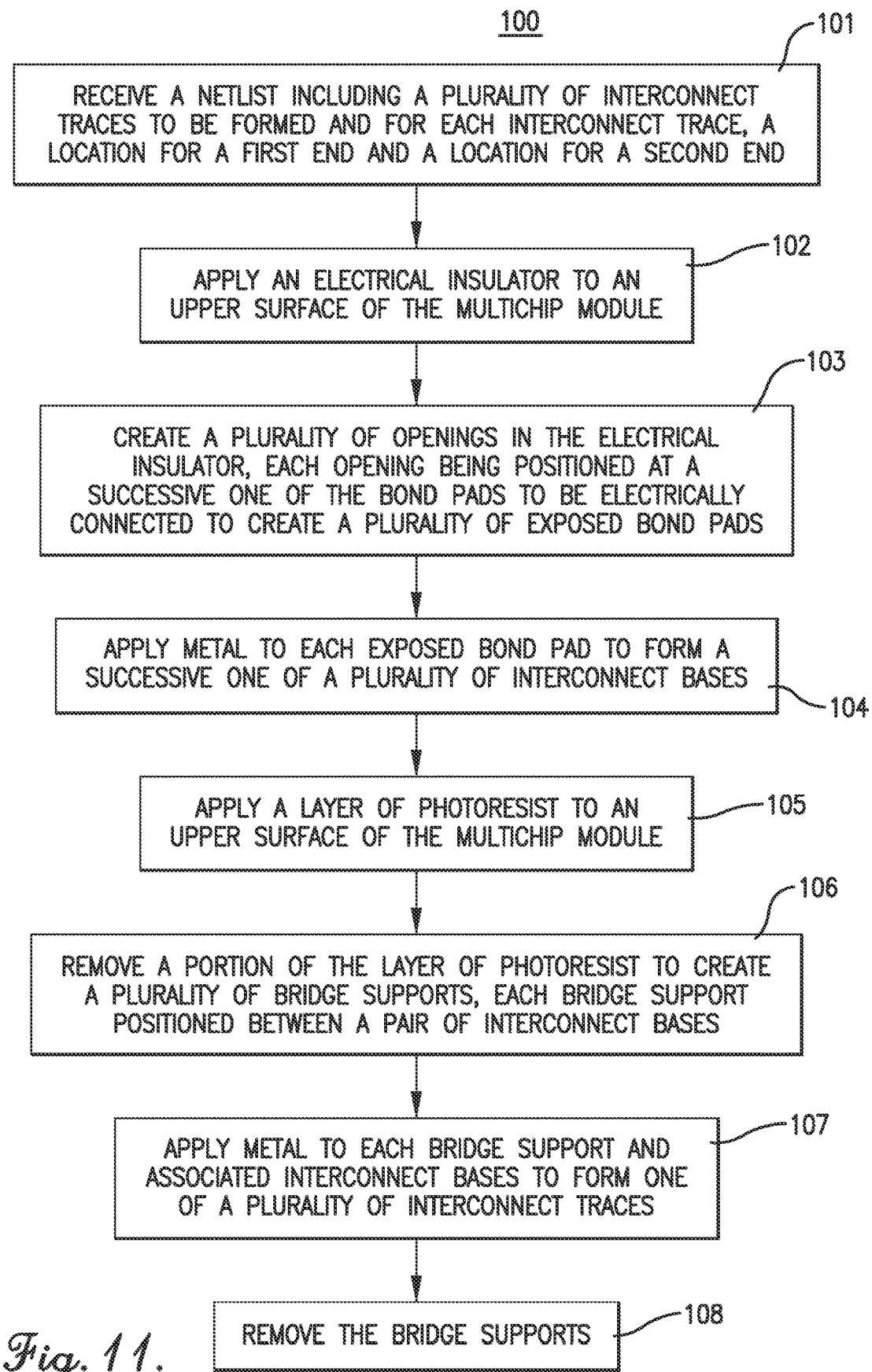
FIG. 11 is a listing of at least a portion of the steps of a method for forming an electrical interconnect structure for use with a multichip module.

At least a portion of the steps of a method 100 for forming an electrical interconnect structure 16 for use with a multichip module 10 is shown in FIG. 11. The steps may be performed in the order shown in FIG. 11, or they may be performed in a different order. Furthermore, some steps may be performed concurrently as opposed to sequentially. In addition, some steps may be optional or may not be performed.

Referring to step 101, a netlist is received. The netlist, or similar informational document, includes a listing of a plurality of interconnect traces 30, with each interconnect trace 30 electrically connecting one bond pad 20 on one chip 12 to one bond pad 20 on another chip 12. The multichip module 10 may already be assembled when the netlist is received, or at least a size or dimensions of the carrier 14 and locations of each chip 12 within the carrier 14 are known. In addition, the locations of each bond pad 20 to be interconnected are known. The locations may be determined on a two-dimensional grid with respect to a reference point. For example, an XY grid may be utilized with the XY origin being positioned at a lower left corner when the multichip module 10 is viewed from above. The coordinates of the XY grid may utilize units of microns.

An exemplary netlist may include at least three columns of data and a plurality of rows of data. The first column may include a listing of the interconnect traces 30, with each interconnect trace 30 being positioned in a successive one of the rows, and with each interconnect trace 30 being identified by a name, a number, a combination of the two, or the like. The second column may include a location of a first bond pad 20 at a first end of each interconnect trace 30, with each first bond pad 20 being positioned in the same row as its associated interconnect trace 30, and with each location being identified with XY coordinates. The third column may include a location of a second bond pad 20 at a second end of each interconnect trace 30, with each second bond pad 20 being positioned in the same row as its associated interconnect trace 30, and with each location being identified with XY coordinates. Alternatively, the netlist may not include columns and rows of data, but instead may include a continuous listing of data having the format of: a first interconnect trace and the locations of its first bond pad and its second bond pad, followed by a second interconnect trace and the locations of its first bond pad and its second bond pad, followed by a third interconnect trace and the locations of its first bond pad and its second bond pad, and so forth, perhaps with each value being separated by a comma. Other embodiments of the netlist may conform to nearly any known format.

Referring to step 102 and FIGS. 2A and 2B, an electrical insulating layer 28 is applied to an upper surface of the multichip module 10. The electrical insulating layer 28 may be formed from electrically insulating materials, such as glass, polyimide, or the like.

Referring to step 103 and FIGS. 3A and 3B, a plurality of openings in the electrical insulating layer 28 are formed. Each opening is positioned on or at a successive one of the bond pads 20 to be electrically connected to create a plurality of exposed bond pads 20.

Steps 102 and 103 may further include the steps of curing the electrical insulating layer 28, exposing the electrical insulating layer 28 to ultraviolet light with a patterned mask, developing the electrical insulating layer 28, and performing a final cure of the electrical insulating layer 28.

Referring to step 104 and FIGS. 4A and 4B, metal is applied to each exposed bond pad 20 to form a successive one of a plurality of interconnect bases 32. The interconnect bases 32 form the first and third segments of the bridge 31. That is, each pair of interconnect bases 32 formed on bond pads 20 in alignment with one another will be the first and third segments of one bridge 31. As shown in the exemplary embodiment of FIG. 4A, there are four pairs of interconnect bases 32 formed on bond pads 20 in alignment with one another. Thus, these interconnect bases 32 will be the first and third segments for each of four bridges 31.

In embodiments that include interconnect traces 30 which electrically connect bond pads 20 not directly aligned with one another across the carrier material 26 channel, such as those shown in FIGS. 8A, 8B, and 8C, interconnect bases 32 are also formed on the bond pads 20 not directly aligned with one another that are part of the first interconnect trace 30A and the second interconnect trace 30B.

The metal may include aluminum, titanium, copper, gold, nickel, palladium, or the like, or alloys thereof. The metal may be applied using any of several techniques, including vapor deposition, sputtering, evaporation, epitaxy, plating such as electroless nickel electroless palladium immersion gold (ENEPIG) plating, and the like, which may form a thin film metal. The metal may be applied to just the bond pads 20. Or, the metal may be applied to a larger area and then a portion of the metal is removed to leave just the metal forming the interconnect bases 32.

Figure 5A:
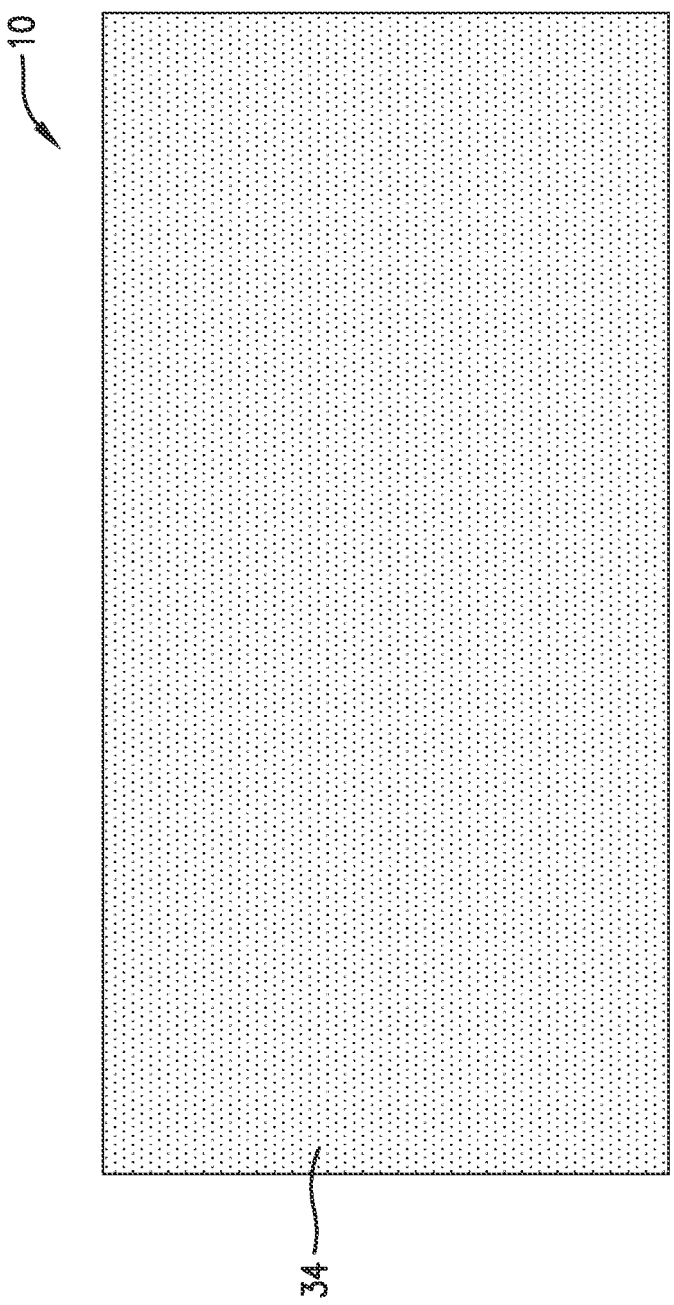
FIG. 5A is a top view of the multichip module with a layer of photoresist applied to the upper surface thereof.
Figure 5B:
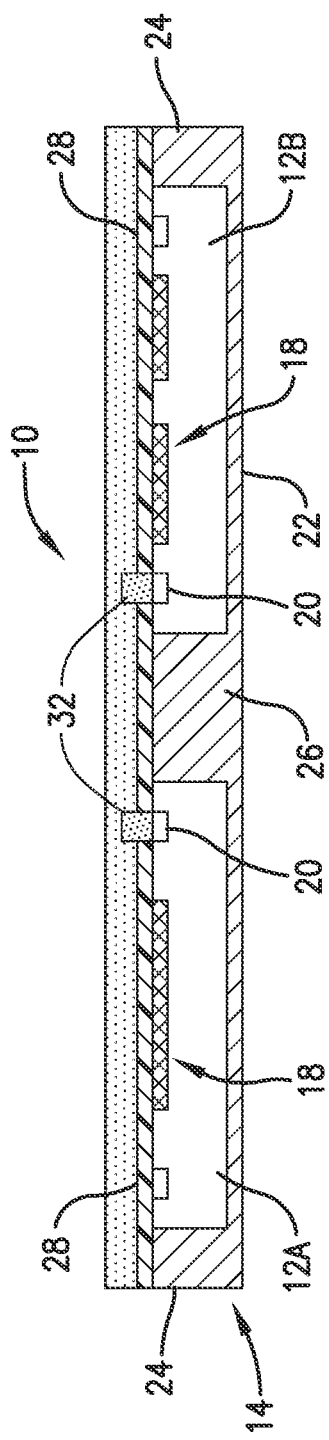
FIG. 5B is a side sectional view, cut along the line 1B-7B of FIG. 1A, of the multichip module with the layer of photoresist applied to the upper surface thereof.

Referring to step 105 and FIGS. 5A and 5B, a layer of photoresist 34 is applied to an upper surface of the multichip module 10. The photoresist 34 may be embodied by one of several types of photoresist, including photopolymeric, photodecomposing, and photocrosslinking photoresist. The photoresist 34 may be applied using any of several methods, including spin coating. The photoresist 34 may be applied to cover the entire upper surface of the multichip module 10 or at least an area in which the electrical interconnect structure 16 will be positioned.

Referring to step 106 and FIGS. 6A and 6B, a portion of the layer of photoresist 34 is removed to create a plurality of bridge supports 36, wherein each bridge support 36 will provide a structure on which a successive one of the bridges 31 is formed. As part of the removal step, the photoresist 34 is removed from each of the interconnect bases 32. Each bridge support 36 is positioned between the first bond pad 20 and its associated interconnect base 32 on the first chip 12A and the second bond pad 20 and its associated interconnect base 32 on the second chip 12B to be electrically connected. Each bridge support 36 has a length approximately equal to the distance between the first bond pad 20 and the second bond pad 20 and has a width approximately equal to a width of the bond pads 20.

Alternatively, a portion of the layer of photoresist 34 is removed to create a single bridge support 36, as shown in FIGS. 9A and 9B, for each pair of chips 12 that have interconnect traces 30 between them. The bridge support 36 may be utilized with directly-connected bond pads 20, such as those of FIGS. 1A and 1B, or with a combination of directly-connected bond pads 20 and indirectly-connected bond pads 20, such as those of FIGS. 8A, 8B, and 8C. The bridge support 36 is generally positioned along the carrier material 26 channel between the chips 12A, 12B and has a width approximately equal to the distance between bond pads 20 next to the carrier material 26 channel on the first chip 12A and bond pads 20 next to the carrier material 26 channel on the second chip 12B. The bridge support 36 has a length approximately equal to the length of the common side of the chips 12A, 12B.

In some embodiments, additional layers of photoresist 34 may be applied and removed in certain areas to create bridge supports 36 of different heights or of variable height. For example, a first bridge support 36 may have a first height, and a second bridge support 36 may have a second height greater than the first height. In addition, one or more bridge supports 36 may each have a height that varies according to location within the bridge support 36, among other factors. For example, one bridge support 36 may have a midpoint with a height that is greater than, or less than, the height at the endpoints.

Steps 105 and 106 may further include the steps of curing the photoresist 34, exposing the photoresist 34 to ultraviolet light with a patterned mask, developing the photoresist 34, and performing a hard bake of the photoresist 34.

Referring to step 107 and FIGS. 7A, 7B, 10A, 10B, and 10C, metal is applied to each bridge support 36, or the bridge support 36 between each adjacent pair of chips 12, and the associated interconnect bases 32 to form a successive one of the interconnect traces 30. The metal may include any of the metals mentioned in step 104 and may be applied using any of the techniques mentioned in step 104. After step 107 is complete, the bridge 31 of each interconnect trace 30 is positioned on a successive one of the bridge supports 36, or a plurality of interconnect traces 30 is positioned on the bridge support 36 between each adjacent pair of chips 12. In some embodiments, processes such as grayscale photolithography or the like may be performed to form interconnect traces 30 and/or bridges 31 which vary in thickness within a single interconnect trace 30 and/or bridge 31.

Referring to step 108 and FIGS. 1A, 1B, 8A, 8B, and 8C, the one or more bridge supports 36 are removed. The one or more bridge supports 36 may be removed using any of several techniques, including etching or stripping. After the removal of the one or more bridge supports 36, each interconnect trace 30 includes a portion, that is the bridge 31, which is spaced apart from, and does not contact, the carrier material 26, the electrical insulating layer 28, or any other object. Thus, each interconnect trace 30 may resiliently flex and not break as the carrier material 26 contracts and expands due to changes in temperature.

In other embodiments, the one or more bridge supports 36 might not be removed. Instead, the one or more bridge supports 36 may flex along with the interconnect traces 30 as the carrier material 26 contracts and expands due to changes in temperature.

Referring to FIGS. 12A and 12B, another embodiment of a multichip module 200 with an improved electrical interconnection is shown in a top view and a cross-sectional view cut along a vertical plane indicated by the line 12B-18B. The multichip module 200 broadly comprises a plurality of chips 212, a carrier 214, and an electrical interconnect structure 216. As shown in the figures, the chips 212 include exemplary first chip 212A and exemplary second chip 212B, which are the same as, or substantially similar to, the chips 12A, 12B described above. Each chip 212 includes integrated circuitry 218 that is the same as, or substantially similar to, the integrated circuitry 18 described above. Each chip 212 also includes a plurality of bond pads 220, each of which being the same as, or substantially similar to, the bond pads 20 described above. The carrier 214 includes a bottom wall 222, four side walls 224, and a carrier material 226 filling the space around the chips 212. The carrier 214, the bottom wall 222, the side walls 224, and the carrier material 226 are the same as, or substantially similar to, the carrier 14 the bottom wall 22, the side walls 24, and the carrier material 26, respectively, described above.

On an upper surface of each chip 212, or on an upper surface of the multichip module 200, is an electrical insulating layer 228, which may be formed from electrically insulating materials, such as glass, polyimide, or the like.

The electrical interconnect structure 216 includes a plurality of interconnect traces 230 and has the same function as the electrical interconnect structure 16 described above. That is, the electrical interconnect structure 216 provides electrical connection from at least a portion of the bond pads 220 on one chip 212 to at least a portion of the bond pads 220 on another chip 212. However, the structure of the interconnect trace 230 is different from the structure of the interconnect trace 30. Each interconnect trace 230 is formed from electrically conductive materials, such as metals or metal alloys. Exemplary metals include aluminum, titanium, copper, gold, nickel, palladium, and the like. Each interconnect trace 230 includes a first end electrically connected to a first bond pad 220 on the first chip 212A, an opposing second end electrically connected to a second bond pad 220 on the second chip 212B, and two bridges 231 and an insulator contact segment 232 therebetween. Each bridge 231 may include a first segment, a second segment, and a third segment. The first segment is generally vertically oriented. The second segment is physically and electrically connected to the first segment and is generally horizontally oriented. The third segment is physically and electrically connected to the second segment and is generally vertically oriented. The insulator contact segment 232 is positioned on the upper surface of, and in contact with, the electric insulating layer 228. The insulator contact segment 232 electrically connects to the third segment of one bridge 231 and the first segment of the other bridge 231. And, one bridge 231 electrically connects to the first bond pad 220 on the first chip 212A, and the other bridge 231 electrically connects to the second bond pad 220 on the second chip 212B. Although the insulator contact segment 232 contacts the electric insulator layer 228 the bridges 231 of the interconnect trace 230 resiliently flex as the carrier material 226 contracts and expands due to changes in temperature—minimizing the probability of the interconnect trace 230 breaking.

In other embodiments, the segments of each bridge 231 may not connect to one another at roughly ninety-degree angles as shown in FIG. 12B. The segments of each bridge 231 may connect to one another such that they are less orthogonal and more rounded.

Although the bridges 231 are shown in the figures as having a uniform width, a uniform thickness, and a uniform height above the electrical insulating layer 228, some bridges 231 may have a different width compared to the width of other bridges 231. Some bridges 231 may have a different thickness compared to the thickness of other bridges 231. And, some bridges 231 may have a different height compared to the height of other bridges 231. In addition, some bridges 231 may have a variable width, wherein the width varies by location on the bridge 231 or other factors. For example, a midpoint of the bridge 231 may be wider or narrower than the endpoints of the bridge 231. Some bridges 231 may have a variable thickness, wherein the thickness varies by location on the bridge 231 or other factors. For example, the midpoint of the bridge 231 may be thicker or thinner than the endpoints of the bridge 231. Some bridges 231 may have a variable height, wherein the height varies by location on the bridge 231 or other factors. For example, the midpoint of the bridge 231 may be farther from, or closer to, the electrical insulating layer 228 than the endpoints of the bridge 231.

Referring to FIGS. 19A, 19B, and 19C, other embodiments of the interconnect structure 216 include interconnect traces 230 that electrically connect bond pads 220 which are not directly aligned with one another across a carrier material 226 channel between adjacent chips 212A, 212B. For example, the interconnect structure 216 includes two interconnect traces 230 that each electrically connect a bond pad 220 on the first chip 212A to a bond pad 220 on the second chip 212B, wherein the bond pads 220 on the first chip 212A are not directly aligned across the carrier material 226 channel with the bond pads 220 on the second chip 212B. (The interconnect structure 216 also includes three interconnect traces 230 for which the bond pads 220 on the first chip 212 are directly aligned with the bond pads 220 on the second chip 212B.) In such embodiments, some interconnect traces 230 include segments that are positioned on an upper surface of, and in contact with, the electrical insulating layer 228, as shown in FIGS. 19B and 19C. For example, a first interconnect trace 230A and a second interconnect trace 230B that connect bond pads 220 not directly aligned with one another each include one or more segments that electrically connect the first bond pad 220 to one end of one of the bridges 231 and one or more segments that electrically connect the second bond pad 220 to one end of the other bridge 231. Those segments are positioned on the upper surface of, and in contact with, the electrical insulating layer 228. In addition, one or more interconnect traces 230 may be routed to avoid other interconnect traces 230. The first interconnect trace 230A and the second interconnect trace 230B each include segments that change directions on the surface of the electrical insulating layer 228 in order to avoid other interconnect traces 230, such as those which electrically connect bond pads 220 directly across the carrier material 226 channel between adjacent chips 212A, 212B.

At least a portion of the steps of a method 300 for forming an electrical interconnect structure 216 for use with a multichip module 200 is shown in FIG. 22. The steps may be performed in the order shown in FIG. 22, or they may be performed in a different order. Furthermore, some steps may be performed concurrently as opposed to sequentially. In addition, some steps may be optional or may not be performed.

Referring to step 301, a netlist is received. The netlist, or similar informational document, includes a listing of a plurality of interconnect traces 230, with each interconnect trace 230 electrically connecting one bond pad 220 on one chip 212 to one bond pad 220 on another chip 212. The multichip module 200 may already be assembled when the netlist is received, or at least a size or dimensions of the carrier 214 and locations of each chip 212 within the carrier 214 are known. In addition, the locations of each bond pad 220 to be interconnected are known. The locations may be determined on a two-dimensional grid with respect to a reference point. For example, an XY grid may be utilized with the XY origin being positioned at a lower left corner when the multichip module 200 is viewed from above. The coordinates of the XY grid may utilize units of microns.

An exemplary netlist may include at least three columns of data and a plurality of rows of data. The first column may include a listing of the interconnect traces 230, with each interconnect trace 230 being positioned in a successive one of the rows, and with each interconnect trace 230 being identified by a name, a number, a combination of the two, or the like. The second column may include a location of a first bond pad 220 at a first end of each interconnect trace 230, with each first bond pad 220 being positioned in the same row as its associated interconnect trace 230, and with each location being identified with XY coordinates. The third column may include a location of a second bond pad 220 at a second end of each interconnect trace 230, with each second bond pad 220 being positioned in the same row as its associated interconnect trace 230, and with each location being identified with XY coordinates. Alternatively, the netlist may not include columns and rows of data, but instead may include a continuous listing of data having the format of: a first interconnect trace and the locations of its first bond pad and its second bond pad, followed by a second interconnect trace and the locations of its first bond pad and its second bond pad, followed by a third interconnect trace and the locations of its first bond pad and its second bond pad, and so forth, perhaps with each value being separated by a comma. Other embodiments of the netlist may conform to nearly any known format.

Figure 13A:
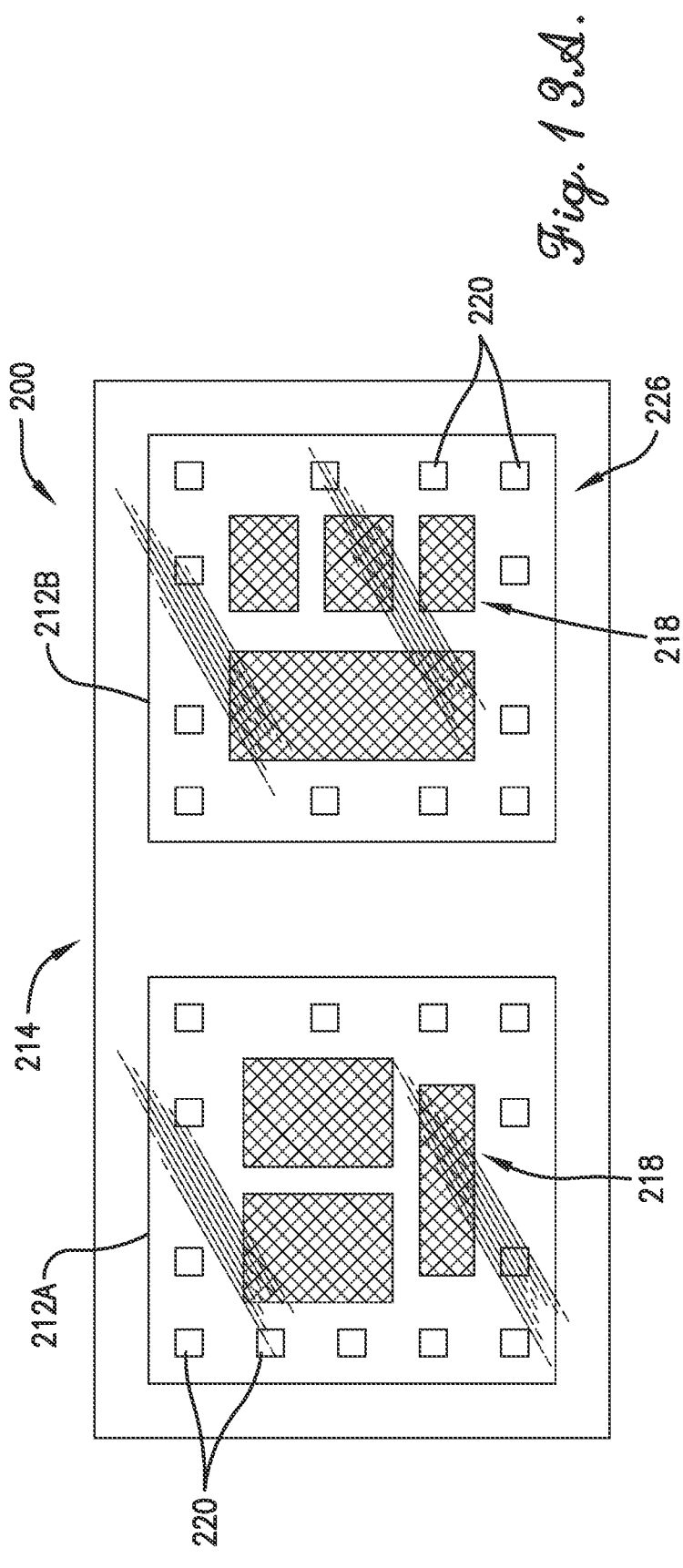
FIG. 13A is a top view of the third embodiment of the multichip module without the electrical interconnect structure.
Figure 13B:
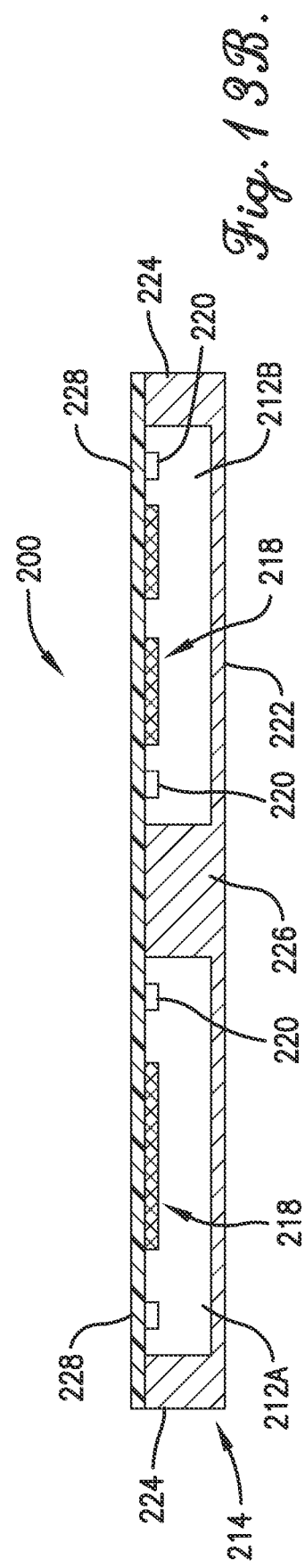
FIG. 13B is a side sectional view, cut along the line 12B-18B of FIG. 12A, of the third embodiment of the multichip module without the electrical interconnect structure.

Referring to step 302 and FIGS. 13A and 13B, an electrical insulating layer 228 is applied to an upper surface of the multichip module 200. The electrical insulating layer 228 may be formed from electrically insulating materials, such as glass, polyimide, or the like.

Referring to step 303 and FIGS. 14A and 14B, a plurality of openings in the electrical insulating layer 228 are formed. Each opening is positioned at successive one of the bond pads 220 to be electrically connected.

Steps 302 and 303 may further include the steps of curing the electrical insulating layer 228, exposing the electrical insulating layer 228 to ultraviolet light with a patterned mask, developing the electrical insulating layer 228, and performing a final cure of the electrical insulating layer 228.

Referring to step 304 and FIGS. 15A and 15B, metal is applied to the openings in the electrical insulating layer 228 to form a plurality of interconnect bases 234. The interconnect bases 234 electrically connect to segments of the bridges 231. As shown in the exemplary embodiment of FIG. 15A, there are four pairs of interconnect bases 234 formed on bond pads 220 in alignment with one another.

In embodiments that include interconnect traces 230 which electrically connect bond pads 220 not directly aligned with one another across the carrier material 226 channel, such as those shown in FIGS. 19A, 19B, and 19C, interconnect bases 234 are also formed on the bond pads 220 not directly aligned with one another that are part of the first interconnect trace 230A and the second interconnect trace 230B.

The metal may include aluminum, titanium, copper, gold, nickel, palladium, or the like, or alloys thereof. The metal may be applied using any of several techniques, including vapor deposition, sputtering, evaporation, epitaxy, plating such as electroless nickel electroless palladium immersion gold (ENEPIG) plating, and the like, which may form a thin film metal. The metal may be applied to just the bond pads 220. Or, the metal may be applied to a larger area and then a portion of the metal is removed to leave just the metal forming the interconnect bases 234.

Referring to step 305 and FIGS. 16A and 16B, a layer of photoresist 236 is applied to an upper surface of the multichip module 200, the interconnect bases 234. The photoresist 236 may be embodied by one of several types of photoresist, including photopolymeric, photodecomposing, and photocrosslinking photoresist. The photoresist 236 may be applied using any of several methods, including spin coating. The photoresist 236 may be applied to cover the entire upper surface of the multichip module 200 or at least an area in which the electrical interconnect structure 216 will be positioned.

Referring to step 306 and FIGS. 17A and 17B, a portion of the layer of photoresist 236 is removed to create a plurality of bridge supports 238, wherein each bridge support 238 will provide a structure on which a successive bridge 231 is formed. That is, pairs of bridge supports 238 provide the structures for each interconnect trace 230, with a first bridge support 238 providing the structure underneath a first bridge 231 and a second bridge support 238 providing the structure underneath a second bridge 231. Each bridge support 238 is positioned adjacent to the edges of the bond pads 220.

Alternatively, a portion of the layer of photoresist 236 is removed to create two bridge supports 238, as shown in FIGS. 20A and 20B, for each pair of chips 212 that have interconnect traces 230 between them. The bridge supports 238 may be utilized with directly-connected bond pads 220, such as those of FIGS. 12A and 12B, or with a combination of directly-connected bond pads 220 and indirectly-connected bond pads 220, such as those of FIGS. 19A, 19B, and 19C. The bridge supports 238 are generally positioned between the bond pads 220 on the first chip 212A and the bond pads 220 on the second chip 212B that are to be electrically connected to one another. For example a first bridge support 238A may be positioned along the bond pads 220 near the edge of the first chip 212A overlapping the carrier material 226 channel between the chips 212A, 212B. A second bridge support 238B may be positioned along the bond pads 220 near the edge of the second chip 212B overlapping the carrier material 226 channel. Each bridge support 238 has a width that extends from the edges of the bond pads 220 into the carrier material 226 channel next to each chip 212. Each bridge support 238 has a length approximately equal to the length of the common side of the chips 212A, 212B.

In some embodiments, additional layers of photoresist 236 may be applied and removed in certain areas to create bridge supports 238 of different heights or of variable height. For example, one bridge support 238 may have a first height, and another bridge support 238 may have a second height greater than the first height. In addition, one or more bridge supports 238 may each have a height that varies according to location within the bridge support 238, among other factors. For example, one bridge support 238 may have a midpoint with a height that is greater than, or less than, the height at the endpoints.

Steps 305 and 306 may further include the steps of curing the photoresist 236, exposing the photoresist 236 to ultraviolet light with a patterned mask, developing the photoresist 236, and performing a hard bake of the photoresist 236.

Referring to step 307 and FIGS. 18A, 18B, 21A, 21B, and 21C, metal is applied to each bridge support 238 and its associated interconnect base 234 to form a successive one of the interconnect traces 230. The metal may include any of the metals mentioned in step 304 and may be applied using any of the techniques mentioned in step 304. After step 307 is complete, the first bridge 231 and the second bridge 231 of each interconnect trace 230 are formed, with each bridge 231 positioned on a successive one of the bridge supports 238. In some embodiments, processes such as grayscale photolithography or the like may be performed to form interconnect traces 230 and/or bridges 231 which vary in thickness within a single interconnect trace 230 and/or bridge 231.

Referring to step 308 and FIGS. 12A, 12B, 19A, 19B, and 19C, the bridge supports 238 are removed. The bridge supports 238 may be removed using any of several techniques. After the bridge supports 238 are removed, the first bridge 231 and the second bridge 231 of each interconnect trace 230 resiliently flex as the carrier material 226 contracts and expands due to changes in temperature—minimizing the probability of any of the interconnect traces 230 breaking.

In other embodiments, the bridge supports 238 might not be removed. Instead, the bridge supports 238 may flex along with the interconnect traces 230 as the carrier material 226 contracts and expands due to changes in temperature.

Another embodiment of the current invention provides a method 400 for tuning a resonant frequency or adjusting an impedance of wireless or wired communication circuitry 18 on a multichip module 10. The method 400 involves the use of the electrical interconnect structure 16. While it may be possible to use the electrical interconnect structure 216, given that the method 400 requires the cutting or disconnection of some interconnect traces, the interconnect traces 30 or bridges 31 of the electrical interconnect structure 16 are likely easier to cut or disconnect than the interconnect traces 230 or bridges 231 of the electrical interconnect structure 216.

At least a portion of the steps of the method 400 is shown in FIGS. 23A and 23B. The steps may be performed in the order shown in FIGS. 23A and 23B, or they may be performed in a different order. Furthermore, some steps may be performed concurrently as opposed to sequentially. In addition, some steps may be optional or may not be performed.

Referring to step 401, a length and a center to center spacing is determined for each of a plurality of interconnect traces 30. Each interconnect trace 30 is electrically connected to a first bond pad 20 on a first chip 12A and a second bond pad 20 on a second chip 12B and includes a bridge 31. The length and the center to center spacing may be determined from computer simulation and/or electrical testing of the wireless communication circuitry 18.

Referring to step 402, a plurality of bond pad locations are determined. Each bond pad 20 is located at one of the opposing ends of a successive one of the interconnect traces 30. The locations are determined according to integrated circuit design rules and the lengths and center to center spacings of the interconnect traces 30 determined in step 401. The bond pads that are utilized for the tuning interconnect traces 30 are labeled as 20A, 20B, 20C, 20D on chip 12A and 20E, 20F, 20G, 20H on chip 12B in FIGS. 24 and 25. There are other bond pads on the chips 12A, 12B utilized for other purposes.

Referring to step 403 and FIG. 24, an electrical insulator 28 is applied to an upper surface of the multichip module 10. The electrical insulator 28 may be formed from electrically insulating materials, such as glass, polyimide, or the like.

Referring to step 404 and FIG. 25, a plurality of openings in the electrical insulator 28 are formed. Each opening is positioned on or at a successive one of the bond pads 20 to be electrically connected to create a plurality of exposed bond pads 20.

Steps 403 and 404 may further include the steps of curing the electrical insulator 28, exposing the electrical insulator 28 to ultraviolet light with a patterned mask, developing the electrical insulator 28, and performing a final cure of the electrical insulator 28.

Referring to step 405 and FIG. 26, metal is applied to each exposed bond pad 20 to form a successive one of a plurality of interconnect bases 32. The interconnect bases 32 form the first and third segments of the bridges 31, which will be added later. That is, each pair of interconnect bases 32 formed on bond pads 20 in alignment with one another will be the first and third segments of one bridge 31. As shown in the exemplary embodiment of FIG. 26, there are four pairs of interconnect bases 32 formed on bond pads 20 in alignment with one another. Thus, these interconnect bases 32 will be the first and third segments for each of four bridges 31.

The metal may include aluminum, titanium, copper, gold, nickel, palladium, or the like, or alloys thereof. The metal may be applied using any of several techniques, including vapor deposition, sputtering, evaporation, epitaxy, plating such as electroless nickel electroless palladium immersion gold (ENEPIG) plating, and the like, which may form a thin film metal. The metal may be applied to just the bond pads 20. Or, the metal may be applied to a larger area and then a portion of the metal is removed to leave just the metal forming the interconnect bases 32.

Referring to step 406 and FIG. 27, a layer of photoresist 34 is applied to an upper surface of the multichip module 10. The photoresist 34 may be embodied by one of several types of photoresist, including photopolymeric, photodecomposing, and photocrosslinking photoresist. The photoresist 34 may be applied using any of several methods, including spin coating. The photoresist 34 may be applied to cover the entire upper surface of the multichip module 10 or at least an area in which the electrical interconnect structure 16 will be positioned.

Referring to step 407 and FIG. 28, a portion of the layer of photoresist 34 is removed to create a plurality of bridge supports 36, wherein each bridge support 36 will provide a structure on which a successive one of the bridges 31 is formed. As part of the removal step, the photoresist 34 is removed from each of the interconnect bases 32. Each bridge support 36 is positioned between the first bond pad 20 and its associated interconnect base 32 on the first chip 12A and the second bond pad 20 and its associated interconnect base 32 on the second chip 12B to be electrically connected. Each bridge support 36 has a length approximately equal to the distance between the first bond pad 20 and the second bond pad 20 and has a width approximately equal to a width of the bond pads 20.

Steps 406 and 407 may further include the steps of curing the photoresist 34, exposing the photoresist 34 to ultraviolet light with a patterned mask, developing the photoresist 34, and performing a hard bake of the photoresist 34.

Referring to step 408 and FIG. 29, metal is applied to each bridge support 36 and the associated interconnect bases 32 to form a successive one of the interconnect traces 30, which form the electrical interconnect structure 16. The metal may include any of the metals mentioned in step 104 and may be applied using any of the techniques mentioned in step 104. After step 407 is complete, the bridge 31 of each interconnect trace 30 is positioned on a successive one of the bridge supports 36.

Referring to step 409 and FIG. 29, the bridge supports 36 are removed. The bridge supports 36 may be removed using any of several techniques. After the removal of the bridge supports 36, each interconnect trace 30 includes a portion, that is the bridge 31, which is spaced apart from, and does not contact, the carrier material 26, the electrical insulating layer 28, or any other object. Thus, each interconnect trace 30 may resiliently flex and not break as the carrier material 26 contracts and expands due to changes in temperature.

Referring to step 410, the communication circuitry 18 is operated. The circuitry may have a test mode so that the inputs to the circuitry can be controlled without having the multichip module 10 fully packaged. The frequencies of the wireless communication signals are then observed and measured using test equipment. Or the impedance, or related electrical characteristics or performance metrics, can be measured.

Referring to step 411 and FIG. 30, one or more of the interconnect traces 30 of the electrical interconnect structure 16 is disconnected as necessary to obtain a target resonant frequency or impedance of the wireless or wired communication circuitry 18. Although FIG. 30 illustrates one of the interconnect traces 30 having been cut, it is possible that none of the interconnect traces 30 might be cut. The interconnect traces 30 may be cut or disconnected using automated machinery, laser ablation, manually, or similar techniques.

ADDITIONAL CONSIDERATIONS

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. A method for tuning a resonant frequency of wireless communication circuitry on a multichip module including a plurality of chips, each chip including a plurality of bond pads, the method comprising:
   applying an electrical insulator to an upper surface of the multichip module;
   creating a plurality of openings in the electrical insulator, each opening being positioned at a successive one of a portion of the bond pads to be electrically connected to create a plurality of exposed bond pads;
   applying metal to each exposed bond pad to form a successive one of a plurality of interconnect bases;
   applying a layer of photoresist to an upper surface of the multichip module;
   removing a portion of the layer of photoresist to create a plurality of bridge supports, each bridge support positioned between a successive pair of interconnect bases;
   applying metal to each bridge support and associated interconnect bases to form a successive one of a plurality of interconnect traces;
   removing the bridge supports; and
   disconnecting one or more of the interconnect traces as necessary to obtain a target resonant frequency.

2. The method of claim 1, further comprising determining a length and a center to center spacing for each of the interconnect traces.

3. The method of claim 1, further comprising determining a location for each of a portion of the bond pads, each bond pad being located at one of opposing ends of a successive one of the interconnect traces.

4. The method of claim 1, wherein disconnecting one or more of the interconnect traces as necessary to obtain the target resonant frequency is performed while operating the wireless communication circuitry.

5. The method of claim 1, wherein applying metal to each exposed bond pad involves electroless nickel electroless palladium immersion gold plating or depositing metal using physical vapor deposition.

6. The method of claim 1, wherein applying metal to each bridge support and associated interconnect bases involves electroless nickel electroless palladium immersion gold plating or depositing metal using physical vapor deposition.

7. The method of claim 1, wherein each interconnect trace is electrically connected to a first bond pad on a first chip and a second bond pad on a second chip.

8. The method of claim 1, wherein the electrically conductive material forming each interconnect trace is a passivated metal.

9. The method of claim 1, wherein the electrically conductive material forming each interconnect trace is a thin film metal.

10. The method of claim 8, wherein the segments include:
    a first segment generally vertically oriented and electrically connected to the first bond pad,
    a second segment generally horizontally oriented and electrically connected to the first segment, and
    a third segment generally vertically oriented and electrically connected to the second segment and the second bond pad.

11. The method of claim 1, wherein each interconnect trace includes a plurality of segments physically connected to one another.

\* \* \* \* \*